US011527826B2

(12) United States Patent
Byun et al.

(10) Patent No.: US 11,527,826 B2
(45) Date of Patent: Dec. 13, 2022

(54) DISPLAY DEVICE

(71) Applicants: SAMSUNG DISPLAY CO., LTD., Yongin-si (KR); UNIST (ULSAN NATIONAL INSTITUTE OF SCIENCE AND TECHNOLOGY), Ulsan (KR)

(72) Inventors: Gangil Byun, Ulsan (KR); Jae-Kyoung Kim, Hwaseong-si (KR); Kiseo Kim, Yongin-si (KR); Wonsang Park, Yongin-si (KR); Jinmyeong Heo, Suwon-si (KR)

(73) Assignees: SAMSUNG DISPLAY CO., LTD., Yongin-si (KR); UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 50 days.

(21) Appl. No.: 17/123,614

(22) Filed: Dec. 16, 2020

(65) Prior Publication Data

US 2021/0313691 A1   Oct. 7, 2021

(30) Foreign Application Priority Data

Apr. 2, 2020   (KR) .......................... 10-2020-0040559

(51) Int. Cl.
*H01Q 5/30* (2015.01)
*G06F 3/044* (2006.01)
(Continued)

(52) U.S. Cl.
CPC ............. *H01Q 5/30* (2015.01); *G06F 3/0443* (2019.05); *G06F 3/0446* (2019.05);
(Continued)

(58) Field of Classification Search
CPC .......... H01Q 5/30; H01Q 1/36; H01Q 9/0457; H01Q 1/38; H01Q 19/005; H01Q 21/08;
(Continued)

(56) References Cited

U.S. PATENT DOCUMENTS

| 10,381,750 B2 | 8/2019 | Jung et al. |
| 2008/0316110 A1 | 12/2008 | Kanemura et al. |

(Continued)

FOREIGN PATENT DOCUMENTS

| KR | 20140100822 A | * | 8/2014 | .......... G06F 3/0448 |
| KR | 1020140120520 | | 10/2014 | |

(Continued)

OTHER PUBLICATIONS

Lee et al., Machine Translation of Foreign Patent Document KR 20140100822A, Touch screen panel having antenna pattern and display device having the same, Aug. 18, 2014, pp. 1-17 (Year: 2014).*

(Continued)

*Primary Examiner* — Amr A Awad
*Assistant Examiner* — Maheen I Javed
(74) *Attorney, Agent, or Firm* — F. Chau & Associates, LLC

(57) ABSTRACT

A display device includes a display panel in which an active area and a peripheral area are defined, and an antenna unit including a main pattern, a first sub-pattern, and an antenna line. The main pattern is disposed on the display panel in the active area, transmits and/or receives a signal, and operates at a first frequency. The first sub-pattern is disposed on the display panel in the active area, is spaced apart from the main pattern in a first direction, is capacitively coupled to the main pattern, and operates at a second frequency different from the first frequency.

28 Claims, 23 Drawing Sheets

(51) Int. Cl.
*H01L 27/32* (2006.01)
*H01Q 1/36* (2006.01)
*H01Q 9/04* (2006.01)

(52) U.S. Cl.
CPC ........ *H01L 27/323* (2013.01); *H01L 27/3225* (2013.01); *H01L 27/3244* (2013.01); *H01Q 1/36* (2013.01); *H01Q 9/0457* (2013.01); *G06F 2203/04111* (2013.01); *G06F 2203/04112* (2013.01)

(58) Field of Classification Search
CPC .......... H01Q 1/44; H01Q 5/385; H01Q 1/243; H01Q 1/242; H01Q 1/273; H01Q 9/0407; H01Q 5/50; G06F 3/0443; G06F 3/0446; G06F 2203/04111; G06F 2203/04112; H01L 27/3225; H01L 27/323; H01L 27/3244; H01L 27/3276; G02F 1/1333
See application file for complete search history.

(56) References Cited

U.S. PATENT DOCUMENTS

| | | | |
|---|---|---|---|
| 2013/0169503 | A1 | 7/2013 | Fakharzadeh Jahromi |
| 2014/0106684 | A1* | 4/2014 | Burns ................... H01Q 21/28 29/601 |
| 2015/0255856 | A1 | 9/2015 | Hong et al. |
| 2016/0093939 | A1* | 3/2016 | Kim ..................... H01Q 21/065 343/720 |
| 2016/0126614 | A1* | 5/2016 | Lim ......................... H01Q 1/44 343/720 |
| 2016/0315397 | A1 | 10/2016 | Sawa |
| 2019/0058264 | A1* | 2/2019 | Jung ................... H01Q 21/065 |

FOREIGN PATENT DOCUMENTS

| | | |
|---|---|---|
| KR | 1020190019802 | 2/2019 |
| KR | 10-1962820 | 3/2019 |
| KR | 1020190069226 | 6/2019 |

OTHER PUBLICATIONS

Syamimi Mohd Norzeli et al., Design of High Gain Microstrip Patch Reader Array Antenna with Parasitic Elements for UHF RFID Application, International Journal of Engineering & Technology, 7 (4.35) (2018) 463-467.

Mekala Harinath Reddy et al., Bandwidth Enhancement of Microstrip Patch Antenna using Parasitic Patch, 017 IEEE International Conference on Smart Technologies and Management for Computing, Communication, Controls, Energy and Materials (ICSTM), Veltech Dr.RR & Dr.SR University, Chennai, T.N., India. Aug. 2-4, 2017. pp. 295-298.

Wei Chen et al., Spectral-Domain Moment-Method Analysis of Coplanar Microstrip Parasitic Subarrays, Microwave and Optical Technology Letters vol. 6, No. 3, Mar. 5, 1993.

J. A. Ansari et al., Analysis of Multilayer Rectangular Patch Antenna for Broadband Operation, Wireless Pers Commun (2012) 62:315-327.

Zurcher J F and Gardiol F E Ed—ZUERCHERI3 ,5-11 J-F et al: "Broadband patch antennas", Jan. 1, 1995 (Jan. 1, 1995), Broadband Patch Antennas; [The Artech House Antenna Library], Boston, MA, Artech House, US, XP002077076, ISBN: 978-0-89006-777-2 p. 3; figure 2.17.

European Extended Search Report dated Aug. 31, 2021 from the European Patent Office corresponding to European Patent Appln. No. 21160848.4.

* cited by examiner

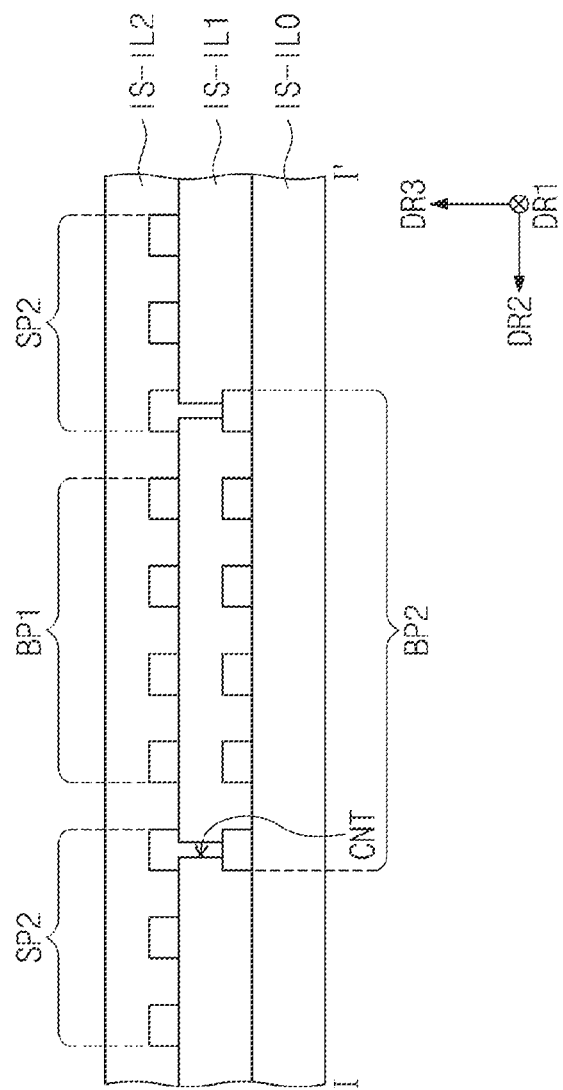

DISPLAY DEVICE

CROSS-REFERENCE TO RELATED APPLICATIONS

This U.S. non-provisional patent application claims priority under 35 U.S.C. § 119 to Korean Patent Application No. 10-2020-0040559, filed on Apr. 2, 2020, the disclosure of which is hereby incorporated by reference in its entirety.

TECHNICAL FIELD

Embodiments of the inventive concept relate to a display device capable of wideband or multiband communication.

DISCUSSION OF THE RELATED ART

A display device may include various electronic modules. For example, a display device may be a portable electronic device such as a smartphone or a wearable device, and the electronic modules may include an antenna module, a camera module, and a battery module. As portable electronic devices become thinner and smaller, the space available for accommodating the electronic modules is decreasing. Furthermore, as the functionality and capability of display devices improve, the number of electronic modules included in the display device increases.

SUMMARY

Embodiments of the inventive concept provide a display device capable of wideband or multiband communication.

According to an embodiment, a display device includes a display panel in which an active area including a light emitting area and a peripheral area adjacent to the active area are defined, and an antenna unit including a main pattern, a first sub-pattern, and an antenna line. The main pattern is disposed in the active area, transmits and/or receives a first signal, and operates at a first frequency. The antenna line is disposed on the display panel and extends from the main pattern. The first sub-pattern is disposed in the active area, is spaced apart from the main pattern in a first direction, is capacitively coupled to the main pattern, and operates at a second frequency different from the first frequency.

In an embodiment, the first frequency is lower than the second frequency, and a width of the main pattern in a second direction crossing the first direction is larger than a width of the first sub-pattern in the second direction.

In an embodiment, a surface area of the main pattern is larger than a surface area of the first sub-pattern.

In an embodiment, the first sub-pattern is provided in plural, and the plurality of first sub-patterns is spaced apart from one another with the main pattern disposed therebetween.

In an embodiment, the plurality of first sub-patterns is spaced apart in the first direction, and the plurality of first sub-patterns is symmetrical in relation to an imaginary line extending in a second direction crossing the first direction.

In an embodiment, the first signal is radiated from the main pattern and has a first frequency band, and a second signal radiated from the first sub-pattern has a second frequency band. A portion of the first frequency band overlaps a portion of the second frequency band.

In an embodiment, the first signal is radiated from the main pattern in a thickness direction of the main pattern, and the second signal is radiated from the first sub-pattern in a thickness direction of the first sub-pattern.

In an embodiment, the display device further includes a second sub-pattern spaced apart from the first sub-pattern in the first direction. The second sub-pattern operates at a third frequency different from the first frequency and the second frequency, and is capacitively coupled to the first sub-pattern.

In an embodiment, the second sub-pattern is spaced apart from the main pattern with the first sub-pattern disposed therebetween.

In an embodiment, the first frequency is higher than the second frequency and the second frequency is higher than the third frequency, a width of the main pattern in a second direction crossing the first direction is smaller than a width of the first sub-pattern in the second direction, and the width of the first sub-pattern in the second direction is smaller than a width of the second sub-pattern in the second direction.

In an embodiment, a width of the main pattern in the first direction is larger than a width of the first sub-pattern in the first direction, and the width of the main pattern in the first direction is larger than a width of the second sub-pattern in the first direction.

In an embodiment, each of the first sub-pattern and the second sub-pattern is provided in plural. The plurality of first sub-patterns is spaced apart from one another with the main pattern disposed therebetween, and the plurality of second sub-patterns is spaced apart from one another with the main pattern disposed therebetween.

In an embodiment, the plurality of first sub-patterns is symmetrical in relation to an imaginary line extending along the antenna line, and the plurality of second sub-patterns is symmetrical in relation to the imaginary line.

In an embodiment, the first signal is radiated from the main pattern and has a first frequency band, a second signal radiated from the first sub-pattern has a second frequency band, and a third signal radiated from the second sub-pattern has a third frequency band. The first frequency band, the second frequency band, and the third frequency band are different from one another.

In an embodiment, the first signal is radiated from the main pattern in a thickness direction of the main pattern, the second signal is radiated from the first sub-pattern in a thickness direction of the first sub-pattern, and the third signal is radiated from the second sub-pattern in a thickness direction of the second sub-pattern.

In an embodiment, the display device further includes a sensing electrode disposed on the display panel and including a plurality of first patterns disposed on a first layer and a plurality of second patterns disposed on a second layer different from the first layer. The main pattern and the first sub-pattern are disposed in a same layer as the plurality of first patterns or the plurality of second patterns.

In an embodiment, the display device further includes an input sensor disposed on the display panel and including a plurality of sensing electrodes. The main pattern and the first sub-pattern are disposed on the input sensor.

In an embodiment, the plurality of sensing electrodes overlaps the main pattern and the first sub-pattern.

In an embodiment, the main pattern and the first sub-pattern have a mesh structure.

In an embodiment, the main pattern and the first sub-pattern do not overlap the light emitting area.

In an embodiment, a width of the main pattern in the first direction is larger than a width of the antenna line in the first direction.

According to an embodiment, a display device includes a display panel in which an active area including a light emitting area and a peripheral area adjacent to the active area are defined, and an antenna unit disposed on the display panel and overlapping the active area. The antenna unit includes a patch antenna that operates at a first frequency and includes a line portion and a patch portion having a width larger than a width of the line portion, and a plurality of first sub-patterns that operates at a second frequency different from the first frequency and are spaced apart from one another with the patch portion disposed therebetween.

In an embodiment, the antenna unit does not overlap the light emitting area when viewed in a plane.

In an embodiment, the display device further includes a sensing electrode disposed on the display panel and including a plurality of first patterns disposed on a first layer and a plurality of second patterns disposed on a second layer different from the first layer. The antenna unit is disposed in a same layer as the plurality of first patterns, and disposed in a different layer from the plurality of second patterns.

In an embodiment, the plurality of second patterns is disposed below the antenna unit, and the plurality of second patterns overlaps the antenna unit when viewed in the plane.

In an embodiment, the plurality of second patterns is disposed on the antenna unit, and the plurality of second patterns does not overlap the antenna unit when viewed in the plane.

In an embodiment, the display device further includes an input sensor disposed on the display panel and including a plurality of sensing electrodes. The antenna unit is disposed on the input sensor.

In an embodiment, the plurality of sensing electrodes overlaps the antenna unit when viewed in the plane.

In an embodiment, a width of the patch portion is larger than a width of each of the plurality of first sub-patterns.

In an embodiment, the display device further includes a plurality of second sub-patterns that operates at a third frequency different from the first frequency and the second frequency, and are spaced apart from the patch portion with the plurality of first sub-patterns respectively disposed therebetween.

In an embodiment, each of the plurality of second sub-patterns is spaced apart from an adjacent one of the plurality of first sub-patterns at a predetermined gap.

In an embodiment, a width of the patch portion is smaller than a width of each of the plurality of first sub-patterns, and the width of each of the plurality of first sub-patterns is smaller than a width of each of the plurality of second sub-patterns.

BRIEF DESCRIPTION OF THE DRAWINGS

The above and other features of the inventive concept will become more apparent by describing in detail embodiments thereof with reference to the accompanying drawings, in which:

FIG. 5B is a cross-sectional view taken along line I-I' of FIG. 5A according to an embodiment of the inventive concept.

DETAILED DESCRIPTION

Figure 1A:
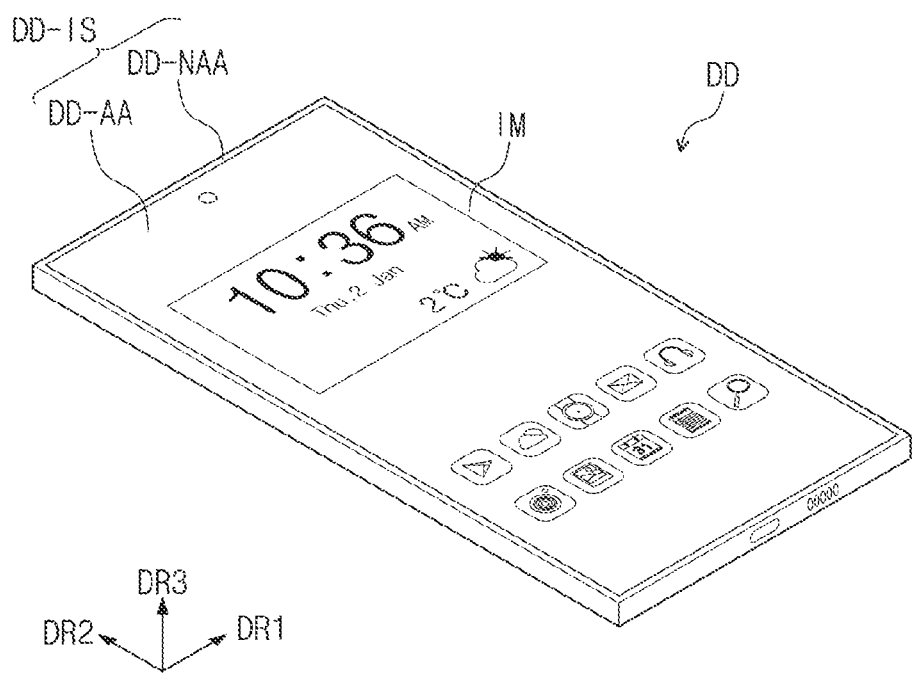
FIG. 1A is a perspective view of a display device according to an embodiment of the inventive concept.

Embodiments of the inventive concept will be described more fully hereinafter with reference to the accompanying drawings. Like reference numerals may refer to like elements throughout the accompanying drawings.

It will be understood that when an element or layer is referred to as being "on", "connected to" or "coupled to" another element or layer, it can be directly on, connected or coupled to the other element or layer, or intervening elements or layers may be present. Similar terms should be construed in a similar fashion.

As used herein, the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section described below could be termed a second element, component, region, layer or section without departing from the teachings of the present inventive concept.

As used herein, the singular forms, "a", "an" and "the" are intended to include the plural forms as well, unless the context clearly indicates otherwise.

Spatially relative terms, such as "beneath", "below", "lower", "above", and "upper", may be used herein for ease of description to describe one element or feature's relationship to another element(s) or feature(s) as illustrated in the figures. Similar terms should be construed in a like manner. It will be understood that the spatially relative terms are intended to encompass different orientations of the device in use or operation in addition to the orientation depicted in the figures.

It will be further understood that the terms "include" or "have", when used in this specification, specify the presence of stated features, integers, steps, operations, elements, and/or components, but do not preclude the presence or addition of one or more other features, integers, steps, operations, elements, components, and/or groups thereof.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Figure 1B:
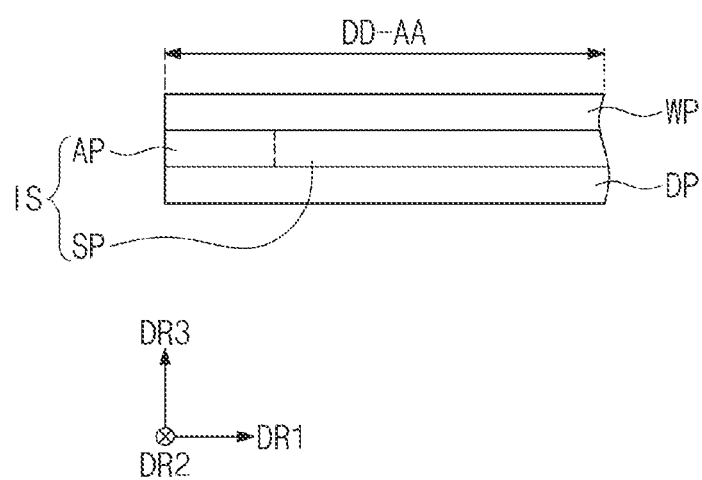
FIG. 1B is a cross-sectional view of a display device according to an embodiment of the inventive concept.

FIG. 1A is a perspective view of a display device according to an embodiment of the inventive concept. FIG. 1B is a cross-sectional view of a display device according to an embodiment of the inventive concept.

Referring to FIGS. 1A and 1B, a display device DD may be a device that is activated according to an electrical signal. For example, the display device DD may be a mobile phone, a tablet computer, a car navigation device, a game machine, or a wearable device, but is not limited thereto. In FIG. 1A, the display device DD is exemplarily illustrated as a mobile phone.

The display device DD may display an image IM through a display surface DD-IS. The display surface DD-IS may include an active area DD-AA and a peripheral area DD-NAA adjacent to the active area DD-AA. The active area DD-AA may be an area in which the image IM is displayed. The peripheral area DD-NAA may be an area in which the image IM is not displayed. The image IM may include a dynamic image and a still image. A clock window and icon images are illustrated in FIG. 1A as an example of the image IM.

The active area DD-AA may be parallel to a surface defined by a first direction DR1 and a second direction DR2 crossing the first direction DR1. A third direction DR3 may indicate a normal direction of the active area DD-AA, that is, a thickness direction of the display device DD.

A front surface (or a top surface) and a rear surface (or a bottom surface) of each of members or units to be described below may be distinguished by the third direction DR3. The third direction DR3 may be a direction crossing the first direction DR1 and the second direction DR2. For example, the first direction DR1, the second direction DR2, and the third direction DR3 may be orthogonal to one another. In this specification, a surface that the first direction DR1 and the second direction DR2 define may be defined as a plane, and "when viewed in a plane" may refer to being viewed in the third direction DR3.

The display device DD may include a display panel DP, an input sensor IS, and a window WP.

The display panel DP may be a component that generates and displays the image IM. The display panel DP may be, for example, a light emitting display panel. However, the display panel DP is not particularly limited. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and/or a quantum rod. Hereinafter the display panel DP is described as an organic light emitting display panel.

The input sensor IS may be disposed on the display panel DP. The input sensor IS may be formed on the display panel DP through a continuous process. Alternatively, the input sensor IS may be bonded to the display panel DP by an adhesive member. The adhesive member may include a typical adhesive or a typical detachable adhesive. For example, the adhesive member may be a transparent adhesive member such as a Pressure Sensitive Adhesive (PSA) film, an Optically Clear Adhesive (OCA) film, or an Optically Clear Resin (OCR).

A sensing part SP and an antenna part AP may be defined in the input sensor IS. The sensing part SP may sense an external input applied from the outside. The external input may be a user input. The user input may include various types of external inputs such as, for example, a part of the user's body, light, heat, pen, and pressure. When viewed in a plane, the sensing part SP may overlap the active area DD-AA.

The antenna part AP may transmit and/or receive a plurality of wireless communication signals, for example, a plurality of radio frequency signals. The plurality of radio frequency signals may respectively have frequency bands different from one another. The antenna part AP may be disposed adjacent to the edge of the sensing part SP. The antenna part AP may be provided in plurality. In this case, the antenna parts AP may be provided extending from at least two sides of the sensing part SP. The input sensor IS may include one sensing part SP and one to four antenna parts AP. However, this is exemplary, and the sensing part SP and the antenna part AP according to embodiments of the inventive concept are not limited thereto.

When viewed in a plane, the antenna part AP may overlap the active area DD-AA. Even when the display device DD is miniaturized or made thinner, or the surface area of the peripheral area DD-NAA is reduced, space in which the antenna part AP is to be disposed may be secured because the surface area of the active area DD-AA is secured. The antenna part AP may be formed simultaneously when the sensing part SP is formed. However, this is exemplary, and the antenna part AP according to embodiments of the inventive concept may be formed by a process different from that of the sensing part SP.

The window WP may be disposed on the input sensor IS. The window WP may include an optically clear insulating material. For example, the window WP may include glass or plastic. The window WP may have a multilayer structure or a single layer structure. For example, the window WP may include a plurality of plastic films bonded by an adhesive, or may include a glass substrate and a plastic film bonded by an adhesive.

Figure 2A:
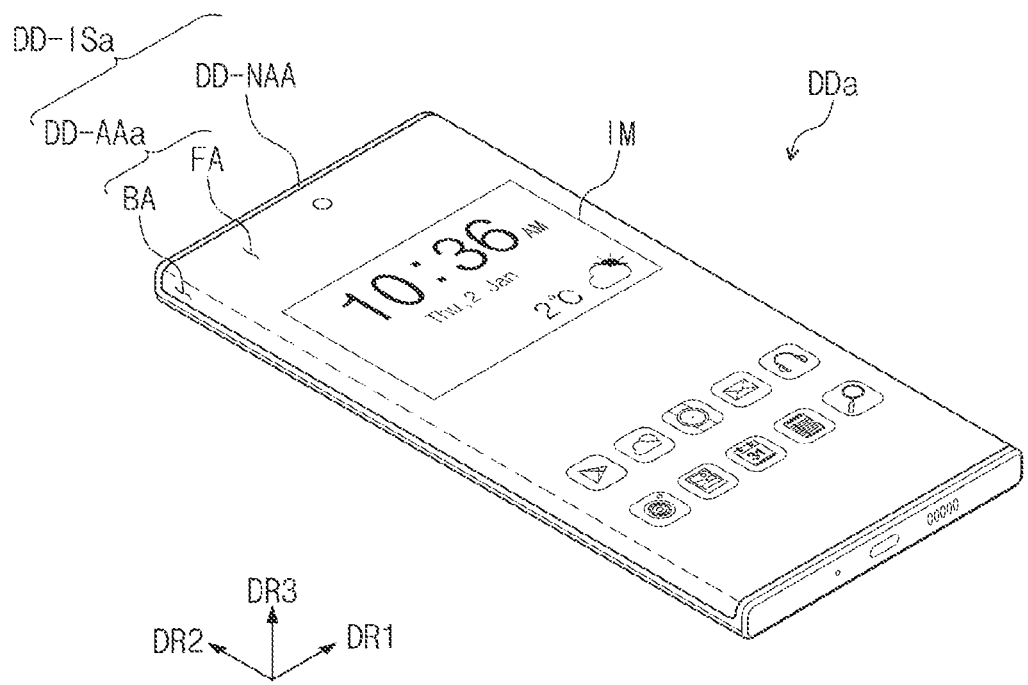
FIG. 2A is a perspective view of a display device according to an embodiment of the inventive concept.
Figure 2B:
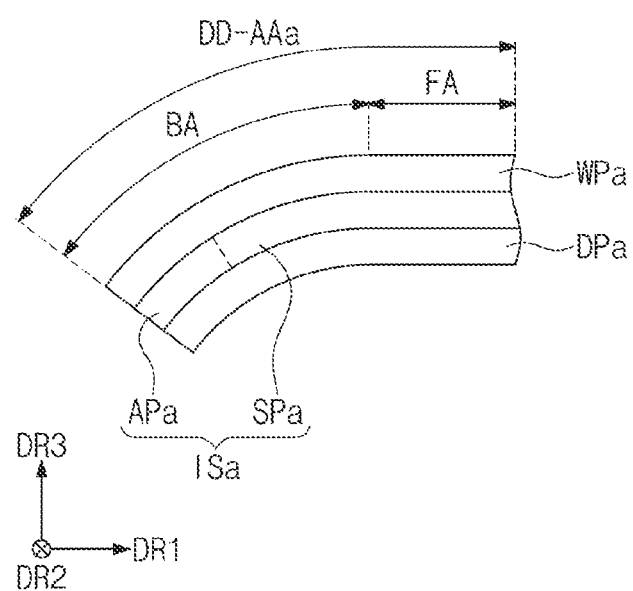
FIG. 2B is a cross-sectional view of a display device according to an embodiment of the inventive concept.

FIG. 2A is a perspective view of a display device according to an embodiment of the inventive concept. FIG. 2B is a cross-sectional view of a display device according to an embodiment of the inventive concept. For convenience of explanation, a further description of elements and technical aspects previously described may be omitted herein.

Referring to FIGS. 2A and 2B, a display device DDa may display an image IM through a display surface DD-ISa. The display surface DD-ISa may include an active area DD-AAa and the peripheral area DD-NAA adjacent to the active area DD-AAa.

A first active area FA and a second active area BA bent from the first active area FA may be defined in the active area DD-AAa. The second active area BA may be provided in plurality. In this case, the second active areas BA may be provided bent from at least two sides of the first active area FA. For example, the active area DD-AAa may include one first active area FA and first to fourth second active areas BA. However, this is exemplary, and the active area DD-AAa according to embodiments of the inventive concept is not limited thereto.

The display device DDa may include a display panel DPa, an input sensor ISa, and a window WPa.

A portion of the display panel DPa overlapping the second active area BA may be bent. A sensing part SPa and an antenna part APa may be defined in the input sensor ISa. When viewed in a plane, the sensing part SPa may overlap the first active area FA and a portion of the second active area BA. The antenna part APa may overlap another portion of the second active area BA.

Figure 3:
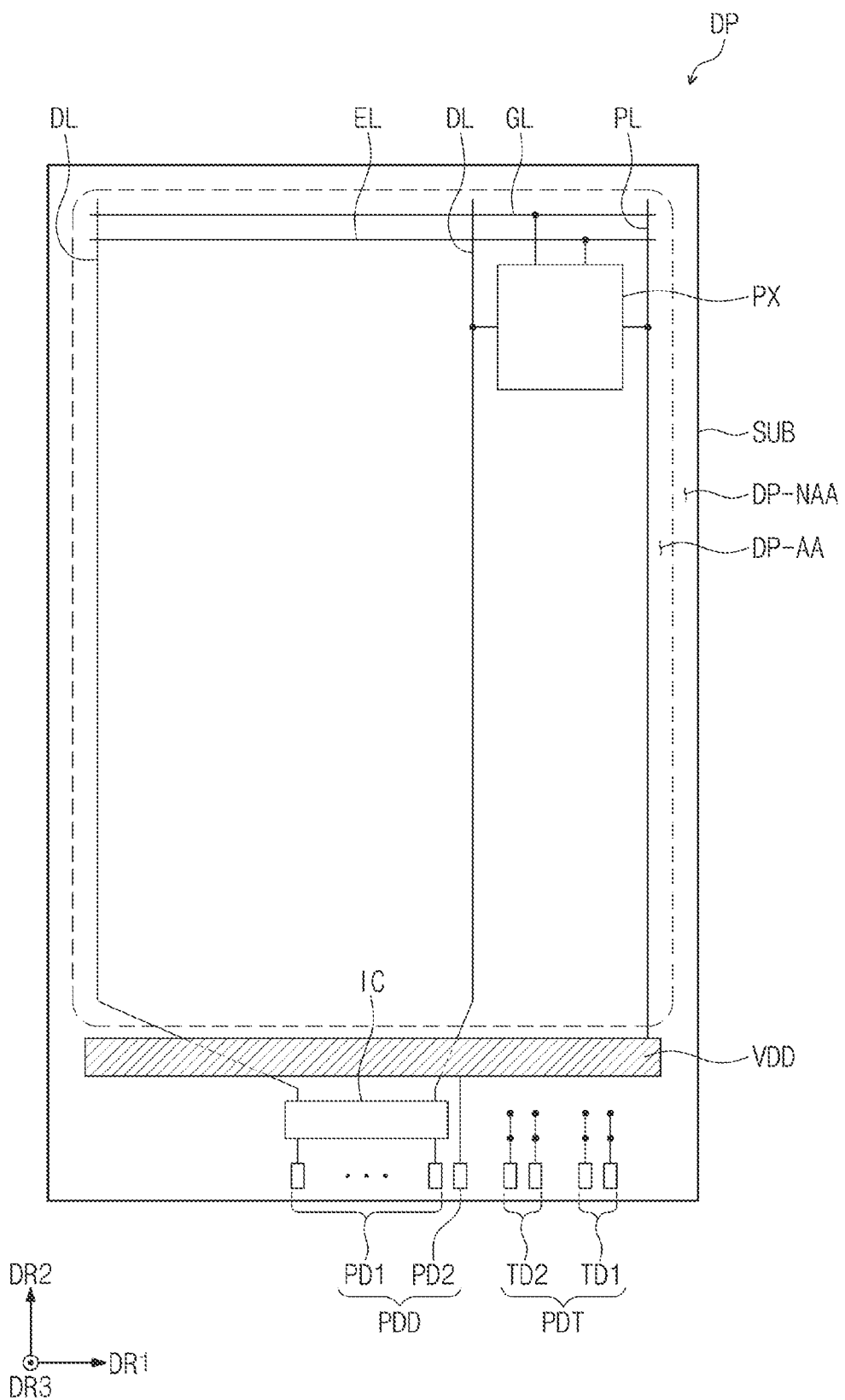
FIG. 3 is a plan view of a display panel according to an embodiment of the inventive concept.

FIG. 3 is a plan view of a display panel according to an embodiment of the inventive concept.

Referring to FIG. 3, an active area DP-AA and a peripheral area DP-NAA adjacent to the active area DP-AA may be defined in the display panel DP. The active area DP-AA may be an area in which the image IM (see FIG. 1A) is displayed. A plurality of pixels PX may be arranged in the active area DP-AA. The peripheral area DP-NAA may be an area in which a driving circuit, a driving wire, etc. is disposed.

Each of the plurality of pixels PX may display one of primary colors or one of mixed colors. The primary colors may include, for example, red, green, or blue, and the mixed colors may include various colors such as, for example, white, yellow, cyan, and magenta. However, the color the pixels PX display is not limited thereto.

The active area DP-AA may correspond to the active area DD-AA (see FIG. 1A) of the display device DD (see FIG. 1A). The peripheral area DP-NAA may correspond to the peripheral area DD-NAA (see FIG. 1A) of the display device DD (see FIG. 1A).

The display panel DP may include a base layer SUB, the plurality of pixels PX, a plurality of signal lines GL, DL, PL, and EL, a plurality of display pads PDD, and a plurality of sensing pads PDT.

The plurality of signal lines GL, DL, PL, and EL may be disposed on the base layer SUB. The plurality of signal lines GL, DL, PL, and EL may be connected to the plurality of pixels PX to transmit electrical signals to the plurality of pixels PX. The plurality of signal lines GL, DL, PL, and EL may include a plurality of scan lines GL, a plurality of data lines DL, a plurality of power lines PL, and a plurality of light emission control lines EL. However, this is exemplary, and the configuration of the plurality of signal lines GL, DL, PL, and EL according to embodiments of the inventive concept is not limited thereto. For example, the plurality of signal lines GL, DL, PL, and EL according to an embodiment of the inventive concept may further include an initialization voltage line.

A power pattern VDD may be disposed in the peripheral area DP-NAA. The power pattern VDD may be connected to the plurality of power lines PL. By including the power pattern VDD, the display panel DP may provide the same power signal to the plurality of pixels PX.

The plurality of display pads PDD may be disposed in the peripheral area DP-NAA. The plurality of display pads PDD may include a first pad PD1 and a second pad PD2. The first pad PD1 may be provided in plurality. In this case, the plurality of first pads PD1 may be respectively connected to the plurality of data lines DL. The second pad PD2 may be connected to the power pattern VDD to be electrically connected to the plurality of power lines PL. The display panel DP may provide the plurality of pixels PX with electrical signals provided through the plurality of display pads PDD from the outside. The plurality of display pads PDD may further include pads for receiving other electrical signals in addition to the first pad PD1 and the second pad PD2.

A driving chip IC may be mounted in the peripheral area DP-NAA. The driving chip IC may be a timing control circuit in the form of a chip. The plurality of data lines DL may be electrically connected to the plurality of first pads PD1, respectively, through the driving chip IC. However, this is exemplary, and the driving chip IC according to embodiments of the inventive concept may be mounted on a film separate from the display panel DP. In this case, the driving chip IC may be electrically connected to the plurality of display pads PDD through the film.

The plurality of sensing pads PDT may be disposed in the peripheral area DP-NAA. The plurality of sensing pads PDT may respectively be electrically connected to a plurality of sensing electrodes of the input sensor IS (see FIG. 1B), which will be described further below. The plurality of sensing pads PDT may include a plurality of first sensing pads TD1 and a plurality of second sensing pads TD2.

Figure 4:
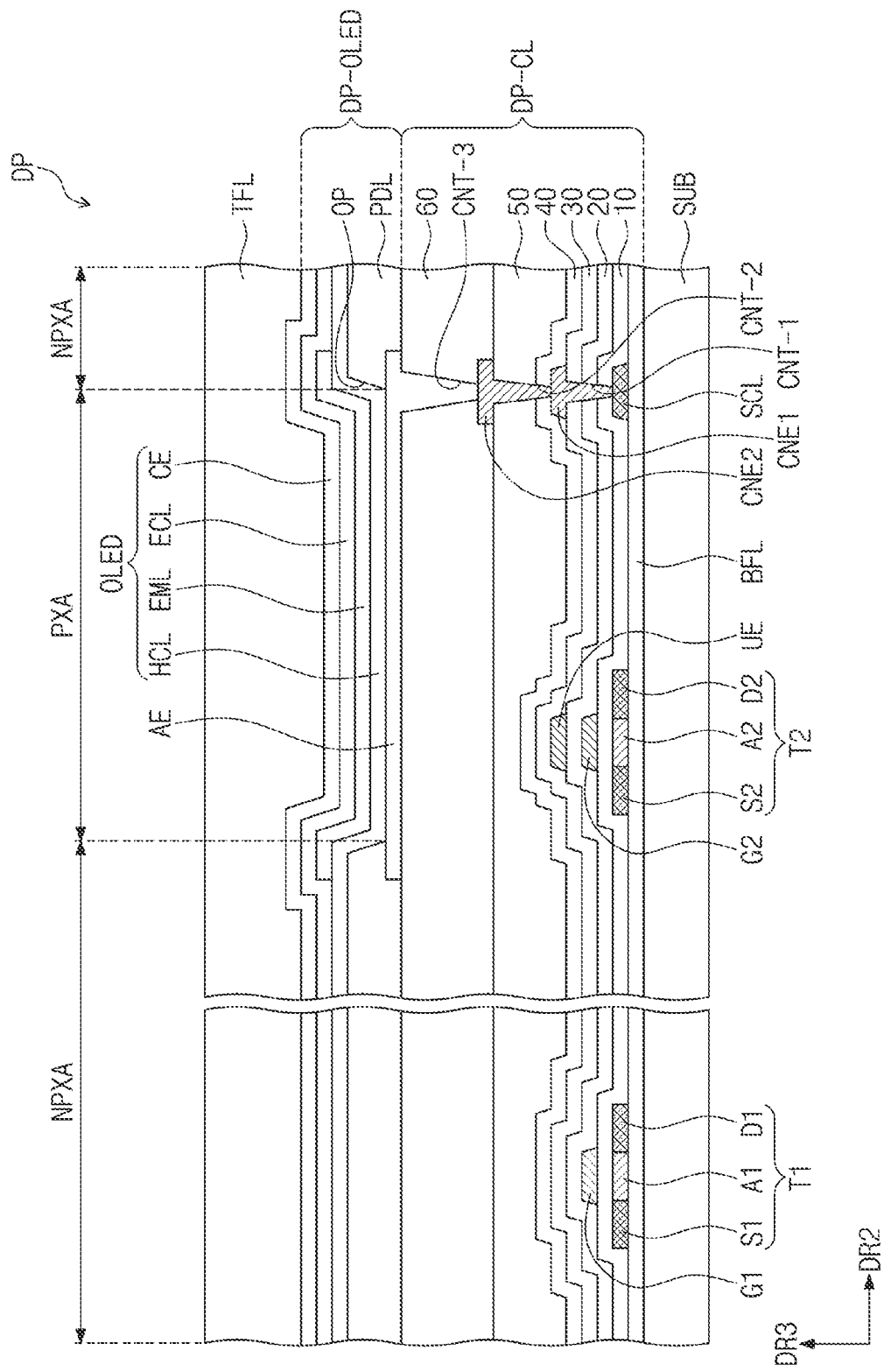
FIG. 4 is a cross-sectional view of a display panel according to an embodiment of the inventive concept.

FIG. 4 is a cross-sectional view of a display panel according to an embodiment of the inventive concept.

Referring to FIG. 4, the display panel DP may include the base layer SUB, a display circuit layer DP-CL, an image implementation layer DP-OLED, and a thin film encapsulation layer TFL. The display circuit layer DP-CL may provide a signal for driving a light emitting element OLED included in the image implementation layer DP-OLED. Each of the plurality of pixels PX (see FIG. 3) may include a second transistor T2 and the light emitting element OLED.

The base layer SUB may include a synthetic resin film. The base layer SUB may have a multilayer structure. For example, the base layer SUB may have a three-layer structure of a synthetic resin layer, an adhesive layer, and a synthetic resin layer. The synthetic resin layer may be a polyimide resin layer. However, this is exemplary, and the type of the synthetic resin layer according to embodiments of the inventive concept is not limited thereto. For example, the synthetic resin layer may include at least one of acrylic resin, methacrylic resin, polyisoprene, vinyl resin, epoxy resin, urethane resin, cellulose resin, siloxane resin, polyamide resin, or perylene resin.

At least one inorganic layer may be formed on a top surface of the base layer SUB. The inorganic layer may include at least one of, for example, aluminum oxide, titanium oxide, silicon oxide, silicon oxynitride, zirconium oxide, or hafnium oxide. The inorganic layer may be formed as multiple inorganic layers. The multiple inorganic layers may constitute a barrier layer and/or a buffer layer. In the embodiment of FIG. 4, the display panel DP is illustrated as including a buffer layer BFL.

The display circuit layer DP-CL may include the buffer layer BFL, a first transistor T1, the second transistor T2, a first insulating layer 10, a second insulating layer 20, a third insulating layer 30, a fourth insulating layer 40, a fifth insulating layer 50, and a sixth insulating layer 60.

The buffer layer BFL may improve the bonding force between the base layer SUB and a semiconductor pattern. The buffer layer BFL may include, for example, a silicon oxide layer and a silicon nitride layer. The silicon oxide layer and the silicon nitride layer may be alternately laminated.

The semiconductor pattern may be disposed on the buffer layer BFL. The semiconductor pattern may include polysilicon. However, this is exemplary, and the type of the semiconductor pattern according to embodiments of the inventive concept is not limited thereto. For example, the semiconductor pattern may include amorphous silicon or metal oxide.

The semiconductor pattern may have different electrical properties depending on whether the semiconductor pattern is doped. The semiconductor pattern may include a doped region and a non-doped region. The doped region may be doped with an N-type dopant or a P-type dopant. An N-type transistor may include a doped region doped with the N-type dopant, and a P-type transistor may include a doped region doped with the P-type dopant.

The doped region has a larger conductivity than the non-doped region, and may function as an electrode or a signal line. The non-doped region may correspond to an active (or channel) of a transistor. That is, a portion of the semiconductor pattern may be the active of the transistor, another portion may be a source or a drain of the transistor, and another portion may be a connection electrode or a connection signal line.

A source S1, an active A1, and a drain D1 of the first transistor T1 are formed from the semiconductor pattern, and a source S2, an active A2, and a drain D2 of the second transistor T2 are formed from the semiconductor pattern. The sources S1 and S2, and the drains D1 and D2 may extend from the actives A1 and A2 in opposite directions. The first transistor T1 may further include a gate G1, and the second transistor T2 may further include a gate G2.

FIG. 4 illustrates a portion of a connection signal line SCL formed from the semiconductor pattern. The connection signal line SCL may be connected to the drain D2 of the second transistor T2 when viewed in a plane.

The first insulating layer 10 may be disposed on the buffer layer BFL. The first insulating layer 10 may cover the first transistor T1 and the second transistor T2. The first insulating layer 10 may be an inorganic layer and/or an organic layer, and may have a single layer structure or a multilayer structure. In addition to the first insulating layer 10, the insulating layer of the display circuit layer DP-CL to be described later may be an inorganic layer and/or an organic layer, and may have a single layer structure or a multilayer structure.

The gates G1 and G2 may be disposed on the first insulating layer 10. The gates G1 and G2 may be a portion of a metal pattern. When viewed in a plane, the gates G1 and G2 may respectively overlap the actives A1 and A2.

The second insulating layer 20 may be disposed on the first insulating layer 10. The second insulating layer 20 may cover the gates G1 and G2.

An upper electrode UE may be disposed on the second insulating layer 20. When viewed in a plane, the upper electrode UE may overlap the gate G2 of the second transistor T2. The upper electrode UE may be a portion of a metal pattern. A portion of the gate G2 and the upper electrode UE overlapping the same may define a capacitor. However, this is exemplary, and the upper electrode UE according to embodiments of the inventive concept may be omitted.

The third insulating layer 30 may be disposed on the second insulating layer 20. The third insulating layer 30 may cover the upper electrode UE. A first connection electrode CNE1 may be disposed on the third insulating layer 30. The first connection electrode CNE1 may be connected to the connection signal line SCL through a contact hole CNT-1 penetrating the first insulating layer 10, the second insulating layer 20, and the third insulating layer 30.

The fourth insulating layer 40 may be disposed on the third insulating layer 30. The fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 penetrating the fourth insulating layer 40 and the fifth insulating layer 50.

The sixth insulating layer 60 may be disposed on the fifth insulating layer 50. The sixth insulating layer 60 may cover the second connection electrode CNE2. The sixth insulating layer 60 may be an organic layer.

The image implementation layer DP-OLED may include a first electrode AE, a pixel defining film PDL, and the light emitting element OLED. The first electrode AE may be disposed on the sixth insulating layer 60. The first electrode AE may be connected to the second connection electrode CNE2 through a contact hole CNT-3 penetrating the sixth insulating layer 60.

An opening OP may be defined in the pixel defining film PDL. The opening OP of the pixel defining film PDL may expose at least a portion of the first electrode AE.

The active area DP-AA (see FIG. 3) may include a light emitting area PXA and a non-light emitting area NPXA adjacent to the light emitting area PXA. The non-light emitting area NPXA may surround the light emitting area PXA. The light emitting area PXA may correspond to the portion of the first electrode AE exposed by the opening OP.

A hole control layer HCL may be disposed in common in the light emitting area PXA and the non-light emitting area NPXA. For example, the hole control layer HCL may be disposed in both the light emitting area PXA and the non-light emitting area NPXA. The hole control layer HCL may include a hole transport layer, and may further include a hole injection layer.

A light emitting layer EML may be disposed on the hole control layer HCL. The light emitting layer EML may be disposed in an area corresponding to the opening OP. The light emitting layer EML may be formed separately in each of the plurality of pixels PX (see FIG. 3). The light emitting layer EML may include a light emitting material. For example, the light emitting layer EML may be formed of at least one of materials that emit red, green, or blue light. The light emitting layer EML may include a fluorescent material or a phosphorescent material. The light emitting layer EML may include an organic light emitting material or an inorganic light emitting material. The light emitting layer EML may emit light in response to a potential difference between the first electrode AE and a second electrode CE.

An electron control layer ECL may be disposed on the light emitting layer EML. The electron control layer ECL may include an electron transport layer, and may further include an electron injection layer.

The second electrode CE may be disposed on the electron control layer ECL. The second electrode CE may have an integral shape and may be disposed in common in the plurality of pixels PX (see FIG. 3). The second electrode CE may include a transmissive conductive material or a transflective conductive material. Accordingly, light generated in the light emitting layer EML may be efficiently emitted in the third direction DR3 through the second electrode CE.

The thin film encapsulation layer TFL may be disposed on the image implementation layer DP-OLED to cover the image implementation layer DP-OLED. The thin film encapsulation layer TFL may include a first inorganic layer, an organic layer, and a second inorganic layer sequentially laminated in the third direction DR3. However, this is exemplary, and the thin film encapsulation layer TFL according to embodiments of the inventive concept is not limited thereto. For example, the thin film encapsulation layer TFL according to an embodiment of the inventive concept may further include a plurality of inorganic layers and a plurality of organic layers.

The first inorganic layer may prevent external moisture or oxygen from permeating the image implementation layer DP-OLED. For example, the first inorganic layer may include a silicon nitride, a silicon oxide, or a compound thereof.

The organic layer may be disposed on the first inorganic layer to provide a flat surface. The organic layer may cover a curved portion formed on a top surface of the first inorganic layer, particles present on the first inorganic layer, etc. For example, the organic layer may include an acrylic organic layer, but is not limited thereto.

The second inorganic layer may be disposed on the organic layer to cover the organic layer. The second inorganic layer may encapsulate, for example, moisture, etc. discharged from the organic layer to prevent the moisture, etc. from flowing out. The second inorganic layer may include, for example, a silicon nitride, a silicon oxide, or a compound thereof.

Figure 5A:
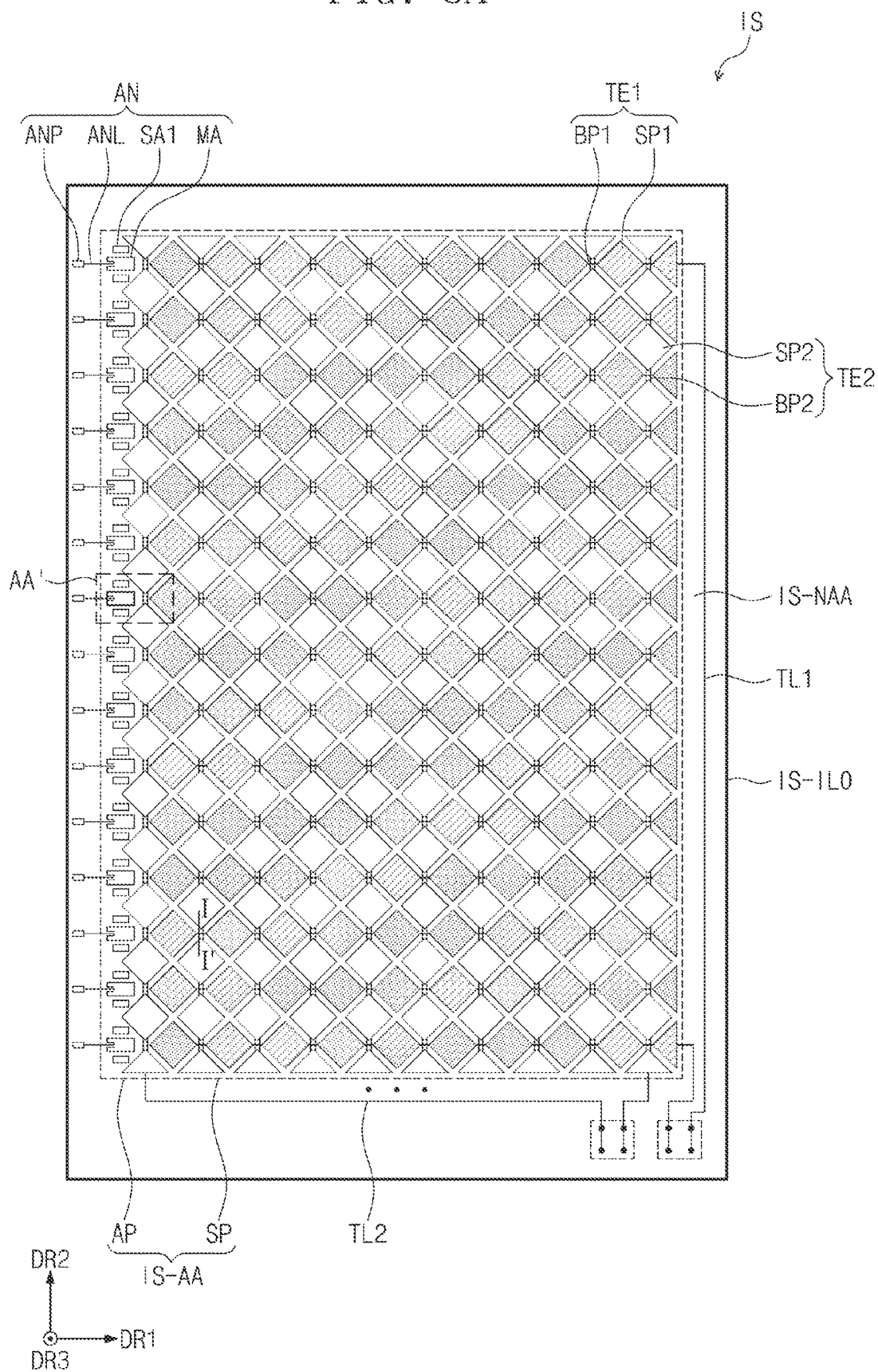
FIG. 5A is a plan view of an input sensor according to an embodiment of the inventive concept.

FIG. 5A is a plan view of an input sensor according to an embodiment of the inventive concept. FIG. 5B is a cross-sectional view taken along line I-I' of FIG. 5A according to an embodiment of the inventive concept.

Referring to FIGS. 5A and 5B, an active area IS-AA and a peripheral area IS-NAA may be defined in the input sensor IS. The active area IS-AA may be an area that is activated according to an electrical signal. The active area IS-AA may be an area corresponding to the active area DD-AA (see FIG. 1A) of the display device DD (see FIG. 1A). When viewed in a plane, the active area IS-AA may overlap the active area DP-AA (see FIG. 3) of the display panel DP (see FIG. 3). The active area IS-AA may include the sensing part SP and the antenna part AP.

The peripheral area IS-NAA may surround the active area IS-AA. The peripheral area IS-NAA may be an area corresponding to the peripheral area DD-NAA (see FIG. 1A) of the display device DD (see FIG. 1A). When viewed in a plane, the peripheral area IS-NAA may overlap the peripheral area DP-NAA (see FIG. 3) of the display panel DP (see FIG. 3).

The input sensor IS may include a base insulating layer IS-IL0, a plurality of sensing electrodes TE1 and TE2, a plurality of sensing lines TL1 and TL2, and a plurality of antenna units AN.

The base insulating layer IS-IL0 may be an inorganic layer including any of, for example, silicon nitride, silicon oxynitride, and silicon oxide. Alternatively, the base insulating layer IS-IL0 may be an organic layer including, for example, epoxy resin, acrylic resin, or imide-based resin. The base insulating layer IS-IL0 may be formed directly on the display panel DP (see FIG. 1B). Alternatively, the base insulating layer IS-IL0 may be bonded to the display panel DP (see FIG. 1B) by an adhesive member.

The plurality of sensing electrodes TE1 and TE2 may be arranged in the sensing part SP. The plurality of sensing electrodes TE1 and TE2 may include a plurality of first sensing electrodes TE1 and a plurality of second sensing electrodes TE2. The input sensor IS may obtain information about an external input by a change in capacitance between the plurality of first sensing electrodes TE1 and the plurality of second sensing electrodes TE2.

Each of the plurality of first sensing electrodes TE1 may extend in the first direction DR1. The plurality of first sensing electrodes TE1 may be arranged in the second direction DR2. Each of the plurality of first sensing electrodes TE1 may include a plurality of first portions SP1 and a plurality of second portions BP1. The plurality of first portions SP1 may also be referred to as a plurality of first sensing patterns SP1, and the plurality of second portions BP1 may also be referred to as a plurality of first bridge patterns BP1.

Each of the plurality of second sensing electrodes TE2 may extend in the second direction DR2. The plurality of second sensing electrodes TE2 may be arranged in the first direction DR1. Each of the plurality of second sensing electrodes TE2 may include a plurality of sensing patterns SP2 and a plurality of bridge patterns BP2. The plurality of sensing patterns SP2 may also be referred to as a plurality of second sensing patterns SP2, and the plurality of bridge patterns BP2 may also be referred to as a plurality of second bridge patterns BP2.

Although FIG. 5A illustrates two second bridge patterns BP2 being exemplarily connected to two adjacent second sensing patterns SP2, the plurality of second bridge patterns BP2 and the plurality of second sensing patterns SP2 according to embodiments of the inventive concept are not limited thereto. For example, in an embodiment, two adjacent second sensing patterns SP2 may be connected to each other by one second bridge pattern BP2.

The plurality of first bridge patterns BP1 may be disposed in a layer different from that of the plurality of second bridge patterns BP2. The plurality of second bridge patterns BP2 may cross the plurality of first sensing electrodes TE1 in an insulated manner. For example, the plurality of first bridge patterns BP1 may respectively cross the plurality of second bridge patterns BP2 in an insulated manner.

The plurality of second bridge patterns BP2 may be disposed on the base insulating layer IS-IL0. A first insulating layer IS-IL1 may be disposed on the plurality of second bridge patterns BP2. The first insulating layer IS-IL1 may cover the plurality of second bridge patterns BP2. The first insulating layer IS-IL1 may have a single layer structure or a multilayer structure. The first insulating layer IS-IL1 may include, for example, an inorganic material, an organic material, or a composite material. The plurality of second bridge patterns BP2 may also be referred to as a plurality of second patterns.

The plurality of second sensing patterns SP2, the plurality of first sensing patterns SP1, and the plurality of first bridge patterns BP1 may be disposed on the first insulating layer IS-ILE The plurality of second sensing patterns SP2, the plurality of first sensing patterns SP1, and the plurality of first bridge patterns BP1 may also be referred to as a plurality of first patterns. The plurality of second sensing patterns SP2, the plurality of first sensing patterns SP1, and the plurality of first bridge patterns BP1 may have a mesh structure.

A plurality of contact holes CNT may be formed by penetrating the first insulating layer IS-IL1 in the third direction DR3. Two adjacent second sensing patterns SP2 among the plurality of second sensing patterns SP2 may be electrically connected to a corresponding second bridge pattern BP2 through a plurality of contact holes CNT corresponding thereto.

A second insulating layer IS-IL2 may be disposed on the plurality of second sensing patterns SP2, the plurality of first sensing patterns SP1, and the plurality of first bridge patterns BP1. The second insulating layer IS-IL2 may cover the plurality of second sensing patterns SP2, the plurality of first sensing patterns SP1, and the plurality of first bridge patterns BP1. The second insulating layer IS-IL2 may have a single layer structure or a multilayer structure. The second insulating layer IS-IL2 may include, for example, an inorganic material, an organic material, or a composite material.

Although FIG. 5B exemplarily illustrates a bottom bridge structure in which the plurality of second bridge patterns BP2 is disposed below the plurality of second sensing patterns SP2, the plurality of first sensing patterns SP1, and the plurality of first bridge patterns BP1, the structure of the input sensor IS according to embodiments of the inventive concept is not limited thereto. For example, the input sensor IS according to an embodiment of the inventive concept may have a top bridge structure in which the plurality of second bridge patterns BP2 is disposed on the plurality of second sensing patterns SP2, the plurality of first sensing patterns SP1, and the plurality of first bridge patterns BP1.

The plurality of sensing lines TL1 and TL2 may include a plurality of first sensing lines TL1 and a plurality of second sensing lines TL2. The plurality of first sensing lines TL1 may be electrically connected to the plurality of first sensing electrodes TE1, respectively. The plurality of second sensing lines TL2 may be electrically connected to the plurality of second sensing electrodes TE2, respectively.

The plurality of first sensing pads TD1 (see FIG. 3) may be electrically connected to the plurality of first sensing lines TL1, respectively, through contact holes. The plurality of second sensing pads TD2 (see FIG. 3) may be electrically connected to the plurality of second sensing lines TL2, respectively, through contact holes.

Each of the plurality of antenna units AN may include a main pattern MA, a plurality of first sub-patterns SA1, an antenna line ANL, and an antenna pad ANP. The main pattern MA and the plurality of first sub-patterns SA1 may be disposed in the antenna part AP. The antenna pad ANP may be disposed in the peripheral area IS-NAA. The antenna line ANL may electrically connect the main pattern MA and the antenna pad ANP. For example, the antenna line ANL may be disposed on the display panel DP, and may extend from the main pattern MA disposed in the active area IS-AA to the antenna pad ANP disposed in the peripheral area IS-NAA.

The main pattern MA and the plurality of first sub-patterns SA1 may include the same material as some of the plurality of sensing electrodes TE1 and TE2, and may be formed through the same process as some of the plurality of sensing electrodes TE1 and TE2. For example, the plurality of first sensing electrodes TE1, the main pattern MA, and the plurality of first sub-patterns SA1 may include carbon nanotubes, metal and/or a metal alloy, or a composite material thereof, and may have a single layer structure or a multilayer structure in which titanium (Ti), aluminum (Al), and titanium (Ti) are sequentially laminated. However, this is exemplary, and the main pattern MA and the plurality of first sub-patterns SA1 according to embodiments of the inventive concept may include a material different from that of the plurality of first sensing electrodes TE1, and may be formed through a process separate from that of the plurality of first sensing electrodes TEE For example, the plurality of first sensing electrodes TE1 may have a multilayer structure in which titanium (Ti), aluminum (Al), and titanium (Ti) are sequentially laminated, and the main pattern MA and the plurality of first sub-patterns SA1 may include carbon nanotubes, metal and/or a metal alloy, or a composite material thereof, and may have a single layer structure or a multilayer structure. For example, the metal material described above may be silver (Ag), copper (Cu), aluminum (Al), gold (Au), or platinum (Pt), and is not limited thereto.

The antenna line ANL may include the same material as the main pattern MA and the plurality of first sub-patterns SA1, and may be formed through the same process as the main pattern MA and the plurality of first sub-patterns SA1. The antenna line ANL may extend from the main pattern MA toward the peripheral area IS-NAA.

The antenna pads ANP may be electrically connected to the antenna lines ANL, respectively.

The plurality of antenna units AN may further include at least one ground electrode disposed below the base insulating layer IS-IL0. However, this is exemplary, and the ground electrode according to embodiments of the inventive concept is not limited thereto. For example, the ground electrode according to an embodiment of the inventive concept may be the second electrode CE (see FIG. 4) of the display panel DP (see FIG. 4).

Figure 6A:
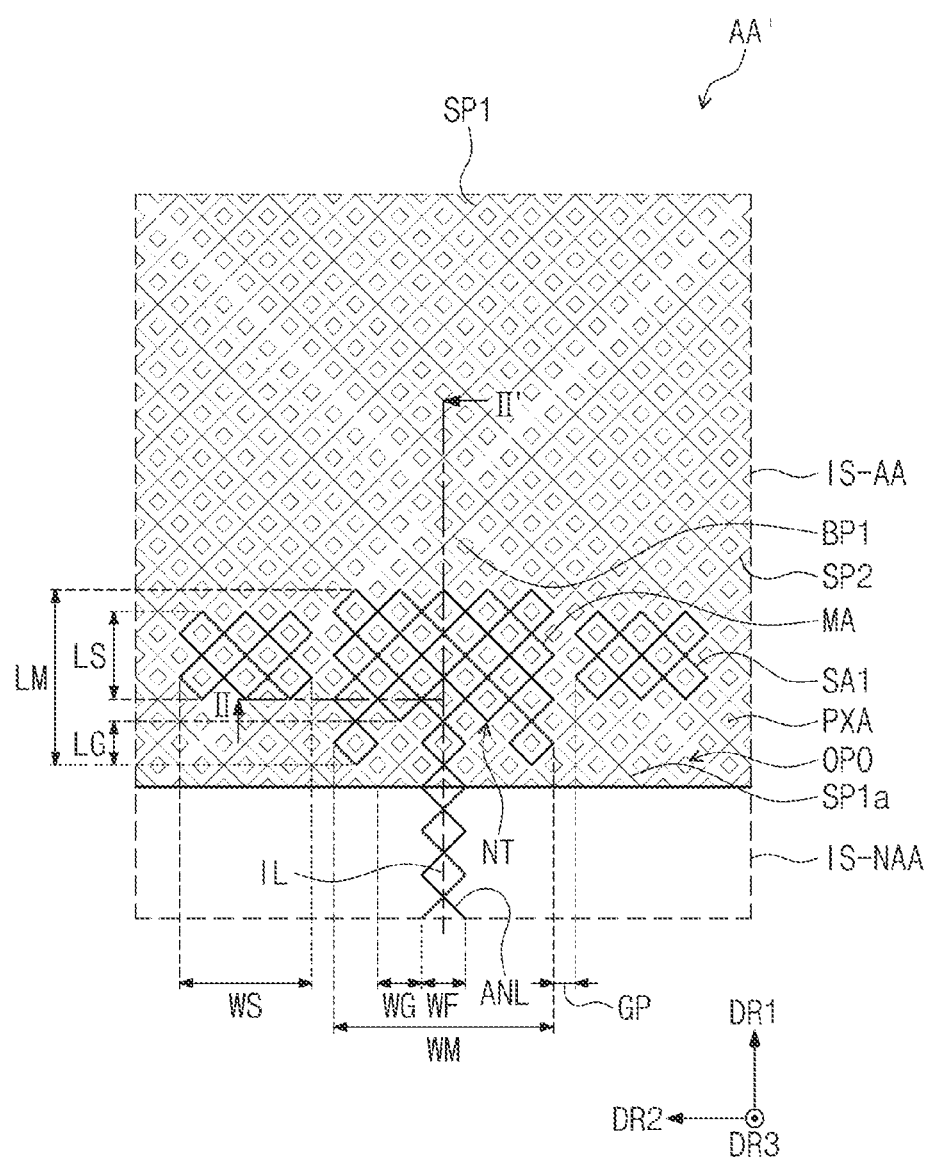
FIGS. 6A and 6B are enlarged plan views of area AA' of FIG. 5A according to embodiments of the inventive concept.

FIG. 6A is an enlarged plan view of area AA' of FIG. 5A according to an embodiment of the inventive concept.

Referring to FIG. 6A, some first portions SP1*a* of the plurality of first sensing patterns SP1 may be patterned in correspondence with shapes of the main pattern MA and the plurality of first sub-patterns SAL For example, each of the first portions SP1*a* may be patterned to be spaced apart from the main pattern MA and the plurality of first sub-patterns SA1 by a predetermined gap. In this case, the surface area of the sensing part SP (see FIG. 5A) for sensing an external input may be increased. In addition, because the sensing part SP (see FIG. 5A) is disposed around the antenna part AP (see FIG. 5A), a phenomenon may be prevented in which the main pattern MA and the plurality of first sub-patterns SA1 are viewed due to differences in reflectance and transmittance, thus improving display quality.

The main pattern MA and the plurality of first sub-patterns SA1 may have a mesh structure. The plurality of first sub-patterns SA1 may be spaced apart from one another with the main pattern MA disposed therebetween. For example, in an embodiment, the first sub-patterns SA1 may be spaced apart from one another in the second direction DR2, and the main pattern MA may be disposed between adjacent first sub-patterns SA1 in the second direction DR2, as shown in FIG. 6A. The main pattern MA and the plurality of first sub-patterns SA1 may overlap the display panel DP (see FIG. 3). The main pattern MA and the plurality of first sub-patterns SA1 may be non-overlapping with the light emitting area PXA. For example, in an embodiment, the main pattern MA and the plurality of first sub-patterns SA1 overlap the display panel DP and do not overlap the light emitting area PXA. The main pattern MA and the plurality of first sub-patterns SA1 may transmit light emitted from the pixels PX. The image IM (see FIG. 1A) provided in the active area DP-AA (see FIG. 3) may be output to the outside through a plurality of openings OP0 defined in the main pattern MA and the plurality of first sub-patterns SA1.

When viewed in a plane, each of the plurality of openings OP0 may overlap the light emitting area PXA.

The mesh structure may refer to a structure in which a plurality of openings is defined in a predetermined layer. The shapes of the main pattern MA and the plurality of first sub-patterns SA1 may be variously changed in the active area IS-AA according to embodiments.

The main pattern MA may be designed to operate at a first frequency. Designing the main pattern MA to operate at a frequency may mean designing the main pattern MA to resonate at the first frequency. Thus, in embodiments, the main pattern MA may resonate at the first frequency, and thus, may operate at the first frequency. The main pattern MA may transmit and/or receive a signal having the first frequency. The main pattern MA may be a patch antenna. The first frequency may be about 23 GHz to about 25 GHz, and in an embodiment, may be about 24 GHz. However, this is exemplary, and the first frequency according to embodiments of the inventive concept may be defined as various frequencies according to a signal with which communication is performed.

The main pattern MA may have a first width LM in the first direction DR1. The first width LM may be inversely proportional to the first frequency. For example, the first width LM may be about 3.9 mm to about 4.3 mm, and in an embodiment, may be about 4.11 mm. However, this is exemplary, and the first width LM according to embodiments of the inventive concept may be determined by a dielectric disposed below the main pattern MA and the first frequency.

The main pattern MA may have a second width WM in the second direction DR2. Impedance of the main pattern MA may be determined by the second width WM. For example, the second width WM may be about 4.8 mm to about 5.1 mm, and in an embodiment, may be about 4.9 mm.

A plurality of notches NT may be defined in a portion of the main pattern MA where the antenna line ANL is connected to the main pattern MA. The impedance of the main pattern MA and impedance of the antenna line ANL may be matched by the plurality of notches NT. For example, the impedance of the main pattern MA, the impedance of the antenna line ANL, and the impedance of the plurality of notches NT may be about the same. The main pattern MA and the antenna line ANL having the matched impedance may reduce loss of a signal transmitted between the main pattern MA and the antenna line ANL.

The antenna line ANL may have a width WF in the second direction DR2. The width WF of the antenna line ANL may be about 0.4 mm to about 0.8 mm, and in an embodiment, may be about 0.58 mm. The impedance of the antenna line ANL may be about 45 Ω to about 55Ω, and in an embodiment, may be about 50Ω. A width LG of each of the plurality of notches NT in the first direction DR1 may be about 1.0 mm to about 1.4 mm, and in an embodiment, may be about 1.23 mm. A width WG of each of the plurality of notches NT in the second direction DR2 may be about 0.1 mm to about 0.5 mm, and in an embodiment, may be about 0.32 mm. The impedance of the main pattern MA and the impedance of the antenna line ANL may be matched by the plurality of notches NT. For example, the impedances of the main pattern MA and the antenna line ANL may be matched at about 50Ω. Accordingly, a display device DD (see FIG. 1A) may be provided which has an improved signal transmission efficiency between the antenna line ANL and the main pattern MA and an improved communication efficiency.

As described above, the main pattern MA may be a patch antenna. In an embodiment, the patch antenna may include the main pattern MA having the width WM and the antenna line ANL having the width WF. In this case, the main pattern MA having the width WM may be referred to as a patch portion of the patch antenna, and the antenna line ANL having the width WF may be referred to as a line portion of the patch antenna.

In an embodiment, a display device DD includes a display panel DP in which an active area DD-AA including a light emitting area PXA and a peripheral area DD-NAA adjacent to the active area DD-AA are defined, and an antenna unit AN disposed on the display panel DP and overlapping the active area DD-AA. The antenna unit AN includes a patch antenna (e.g., the main pattern MA) that radiates a first signal at a first frequency in a thickness direction of the patch antenna, and a plurality of first sub-patterns SA1 that radiates a second signal at a second frequency different from the first frequency in a thickness direction of the plurality of first sub-patterns SA1, in which the plurality of first sub-patterns SA1 is spaced apart from one another with the patch antenna disposed therebetween.

Each of the plurality of first sub-patterns SA1 may be designed to operate at a second frequency different from the first frequency. For example, each of the plurality of first sub-patterns SA1 may resonate at the second frequency, and thus, may operate at the second frequency. Each of the plurality of first sub-patterns SA1 may transmit and/or receive a signal having the second frequency. The second frequency may be higher than the first frequency. The second frequency may be a frequency adjacent to the first frequency. For example, the second frequency may be about 22 GHz to about 24 GHz, and in an embodiment, may be about 23.5 GHz. However, this is exemplary, and the second frequency according to embodiments of the inventive concept may be defined as various frequencies according to a signal with which communication is performed.

Each of the plurality of first sub-patterns SA1 may have a first width LS in the first direction DR1. The first width LS may be inversely proportional to the second frequency. The first width LS may be determined by the second frequency. The first width LM of the main pattern MA may be greater than the first width LS of each of the plurality of first sub-patterns SA1.

The surface area of the main pattern MA may be larger than the surface area of each of the plurality of first sub-patterns SA1.

Each of the plurality of first sub-patterns SA1 may have a second width WS in the second direction DR2. The second width WS may determine capacitance between the plurality of first sub-patterns SA1 and the main pattern MA. The capacitance may be inversely proportional to the second width WS.

Each of the plurality of first sub-patterns SA1 may be spaced apart from the main pattern MA at a predetermined gap GP in the second direction DR2. The capacitance may be determined by the gap GP. The capacitance may be inversely proportional to the gap GP.

The plurality of first sub-patterns SA1 and the main pattern MA may be capacitively coupled by the capacitance. The capacitance may change resonance frequencies at which the main pattern MA and the plurality of first sub-patterns SA1 respectively resonate.

The plurality of first sub-patterns SA1 may be spaced apart from one another in the second direction DR2 with the main pattern MA interposed therebetween. The plurality of first sub-patterns SA1 may be symmetrical in relation to an imaginary line IL extending in the first direction DR1. The imaginary line IL may overlap the main pattern MA and the antenna line ANL.

According to an embodiment of the inventive concept, the antenna unit AN (see FIG. 5A) may radiate a plurality of wireless communication signals in the third direction DR3 by the main pattern MA and the plurality of first sub-patterns SA1 disposed in bilateral symmetry in relation to the imaginary line IL. The plurality of wireless communication signals may have certain directionality, and communication efficiency may be improved. Accordingly, the display device DD (see FIG. 1A) with improved communication efficiency may be provided.

Figure 6B:
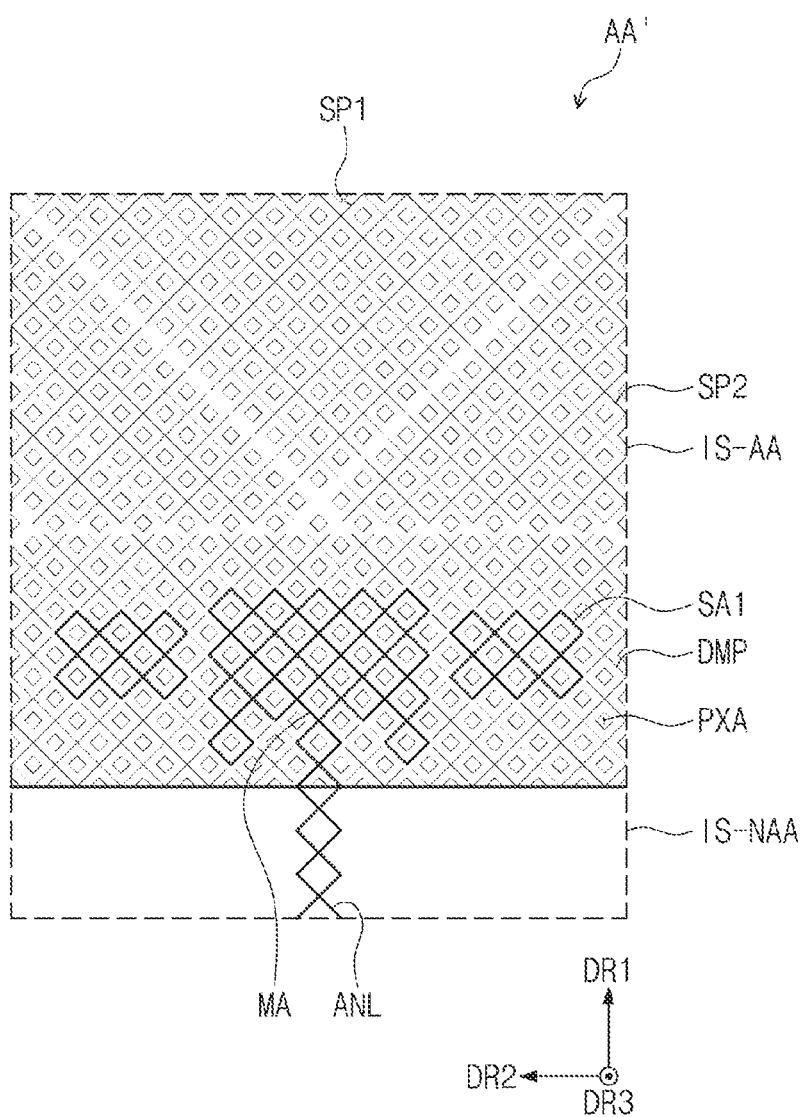

FIG. 6B is an enlarged plan view of area AA' of FIG. 5A according to an embodiment of the inventive concept. For convenience of explanation, a further description of elements and technical aspects previously described may be omitted herein.

Referring to FIG. 6B, the input sensor IS may further include a dummy pattern DMP. The dummy pattern DMP may be disposed between the plurality of sensing electrodes TE1 and TE2 and the main pattern MA. The dummy pattern DMP may be disposed between the plurality of sensing electrodes TE1 and TE2 and the first sub-patterns SA1.

The dummy pattern DMP may surround the main pattern MA and the plurality of first sub-patterns SA1. The dummy pattern DMP may have a mesh structure. Utilization of the dummy pattern DMP may reduce a difference between reflectance of an area in which the main pattern MA and the plurality of first sub-patterns SA1 are disposed and reflectance of an area in which the main pattern MA and the plurality of first sub-patterns SA1 are not disposed. Accordingly, utilization of the dummy pattern DMP may prevent the main pattern MA and the plurality of first sub-patterns SA1 from being viewed from the outside.

When the dummy pattern DMP is not disposed, the reflectance and transmittance of the area in which the main pattern MA and the plurality of first sub-patterns SA1 are not disposed may respectively be different from the reflectance and transmittance of the area in which the main pattern MA and the plurality of first sub-patterns SA1 are disposed. However, according to an embodiment of the inventive concept, the difference between the reflectances and the difference between the transmittances may be reduced by implementing the dummy pattern DMP. As a result, a phenomenon may be prevented in which a particular boundary, for example, a boundary between the main pattern MA and the plurality of first sub-patterns SA1 and the plurality of sensing patterns SP2, is viewed.

Figure 7A:
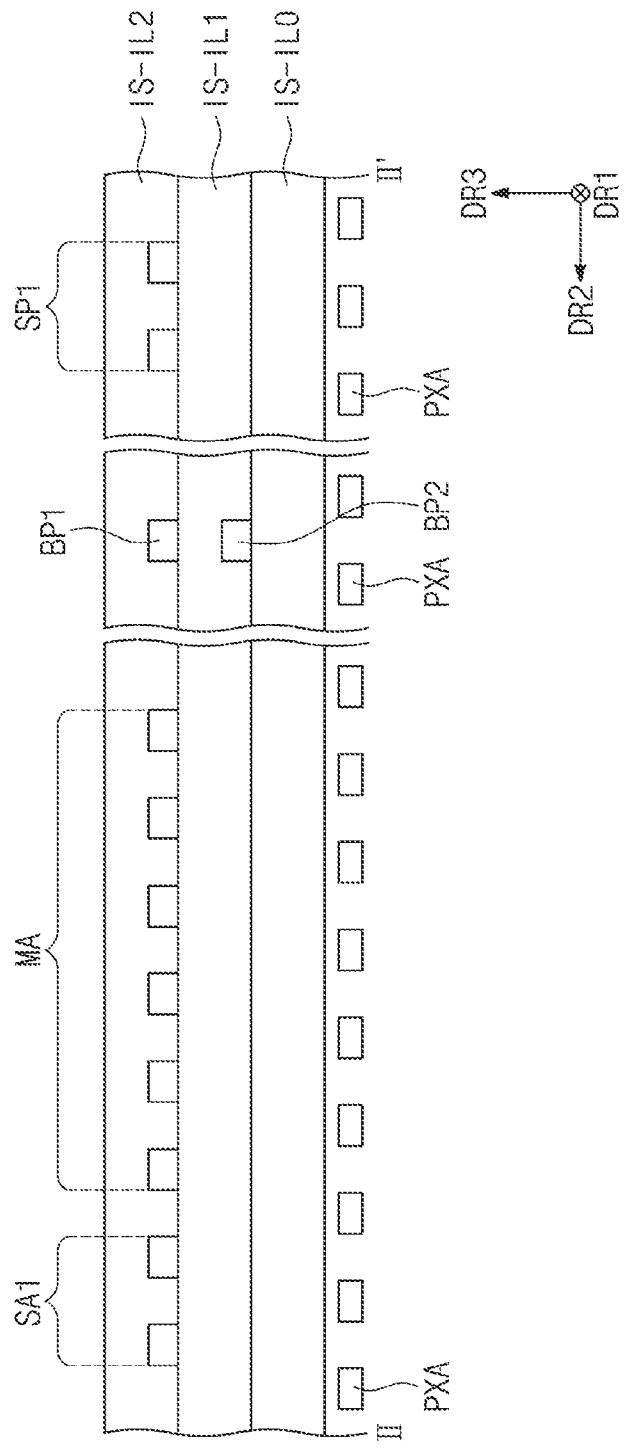
FIGS. 7A and 7B are cross-sectional views taken along line II-II' of FIG. 6A according to embodiments of the inventive concept.

FIG. 7A is a cross-sectional view taken along line II-II' of FIG. 6A according to an embodiment of the inventive concept.

Referring to FIG. 7A, the main pattern MA and the plurality of first sub-patterns SA1 may be disposed on the first insulating layer IS-IL1. The second insulating layer IS-IL2 may be disposed on the first insulating layer IS-IL1. The second insulating layer IS-IL2 may cover the main pattern MA and the plurality of first sub-patterns SA1. In an embodiment, when viewed in a plane, the main pattern MA and the plurality of first sub-patterns SA1 do not overlap the light emitting area PXA.

The plurality of second bridge patterns BP2 may be disposed on the base insulating layer IS-IL0. The first insulating layer IS-IL1 may be disposed on the base insulating layer IS-IL0. The first insulating layer IS-IL1 may cover the plurality of second bridge patterns BP2. The plurality of first bridge patterns BP1 may be disposed on the first insulating layer IS-IL1. When viewed in a plane, the plurality of first bridge patterns BP1 may overlap the plurality of second bridge patterns BP2. The plurality of first bridge patterns BP1 may be disposed in the same layer as the main pattern MA and the plurality of first sub-patterns SA1. When viewed in a plane, the plurality of second bridge patterns BP2 and the plurality of first bridge patterns BP1 may be non-overlapping with the light emitting area PXA. For example, in an embodiment, when viewed in a plane, the plurality of second bridge patterns BP2 and the plurality of first bridge patterns BP1 do not overlap the light emitting area PXA. The second insulating layer IS-IL2 may cover the plurality of first bridge patterns BP1.

The plurality of first sensing patterns SP1 may be disposed on the first insulating layer IS-IL1. The plurality of first sensing patterns SP1 may be disposed in the same layer as the plurality of first bridge patterns BP1, the main pattern MA, and the plurality of first sub-patterns SA1. The plurality of first sensing patterns SP1, the plurality of first bridge patterns BP1, the main pattern MA, and the plurality of first sub-patterns SA1 may be formed by the same process. However, this is exemplary, and the process of forming these elements according to embodiments of the inventive concept is not limited thereto. For example, in an embodiment, the plurality of first sensing patterns SP1 may be formed through the same process as the plurality of first bridge patterns BP1, and the main pattern MA may be formed by the same process as the plurality of first sub-patterns SA1. When viewed in a plane, the plurality of first sensing patterns SP1 may be non-overlapping with the light emitting area PXA. For example, in an embodiment, when viewed in a plane, the plurality of first sensing patterns SP1 does not overlap the light emitting area PXA. The second insulating layer IS-IL2 may cover the plurality of first sensing patterns SP1.

Figure 7B:
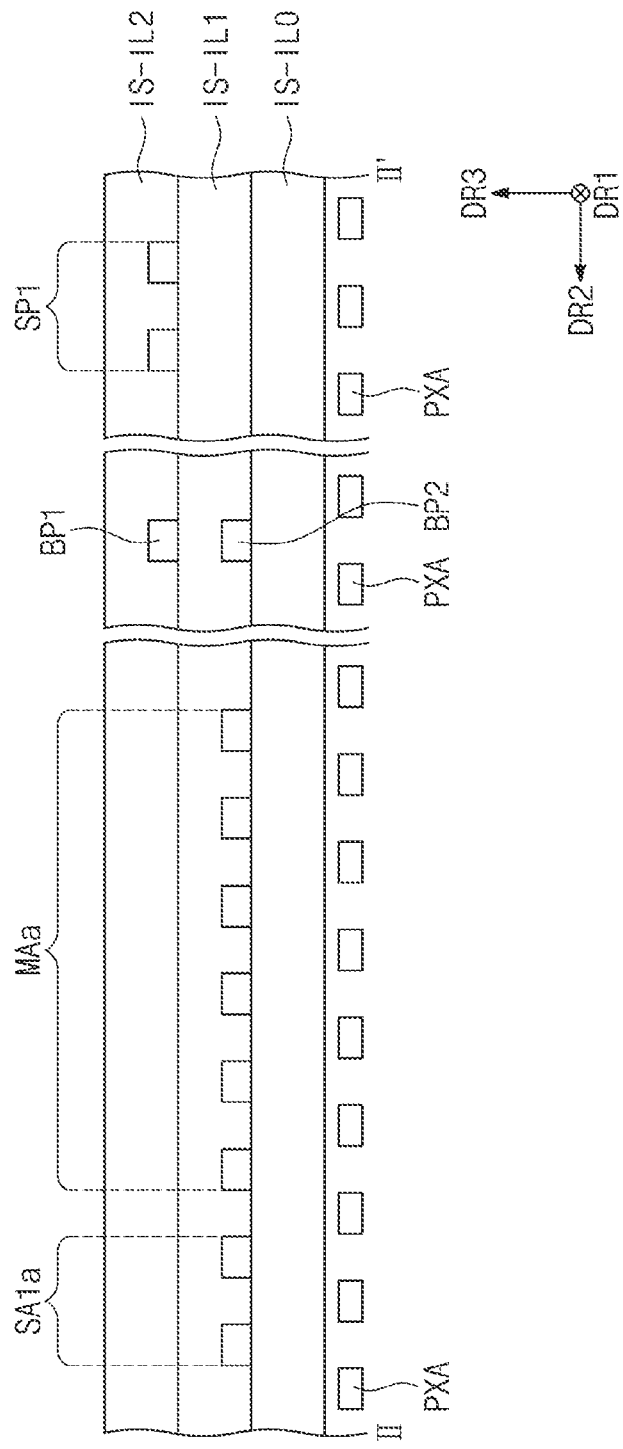

FIG. 7B is a cross-sectional view taken along line II-II' of FIG. 6A according to an embodiment of the inventive concept. For convenience of explanation, a further description of elements and technical aspects previously described may be omitted herein.

Referring to FIG. 7B, a main pattern MAa and a plurality of first sub-patterns SA1a may be disposed on the base insulating layer IS-IL0. The first insulating layer IS-IL1 may cover the main pattern MAa and the plurality of first sub-patterns SA1a. When viewed in a plane, the main pattern MAa and the plurality of first sub-patterns SA1a may be non-overlapping with the light emitting area PXA. For example, in an embodiment, when viewed in a plane, the main pattern MAa and the plurality of first sub-patterns SA1a do not overlap the light emitting area PXA.

The main pattern MAa and the plurality of first sub-patterns SA1a may be disposed in the same layer as the plurality of second bridge patterns BP2. The main pattern MAa, the plurality of first sub-patterns SA1a, and the plurality of second bridge patterns BP2 may be formed by the same process. However, this is exemplary, and the process of forming the main pattern MAa, the plurality of first sub-patterns SA1a, and the plurality of second bridge patterns BP2 according to embodiments of the inventive concept is not limited thereto. For example, in an embodiment, the main pattern MAa may be formed by the same process as the plurality of first sub-patterns SA1a, and the plurality of second bridge patterns BP2 may be formed by the same process.

Figure 8A:
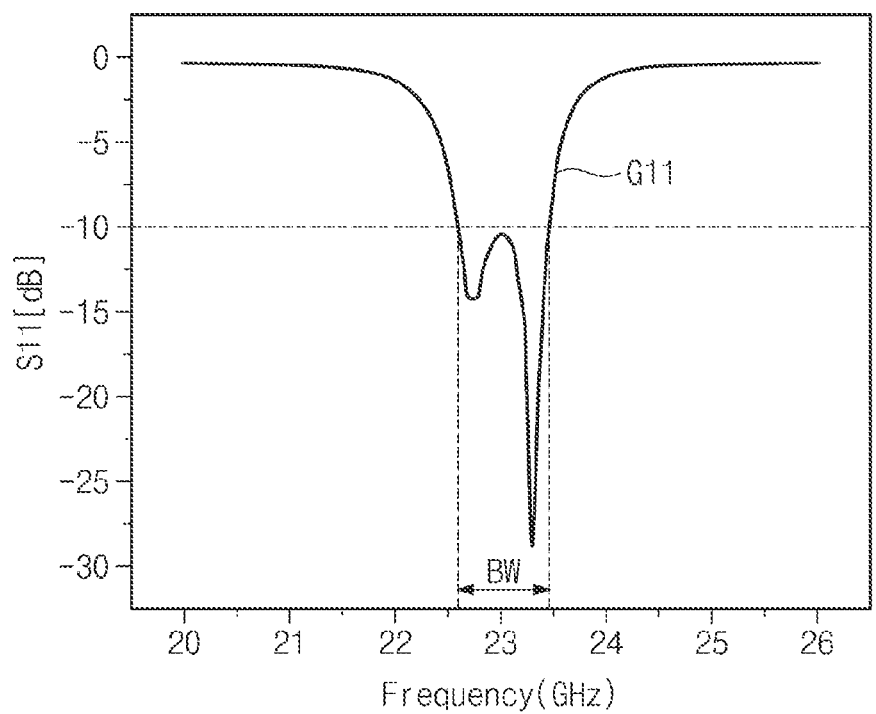
FIGS. 8A and 8B are graphs showing an S-parameter, according to frequency, of an antenna unit according to embodiments of the inventive concept.
Figure 8B:
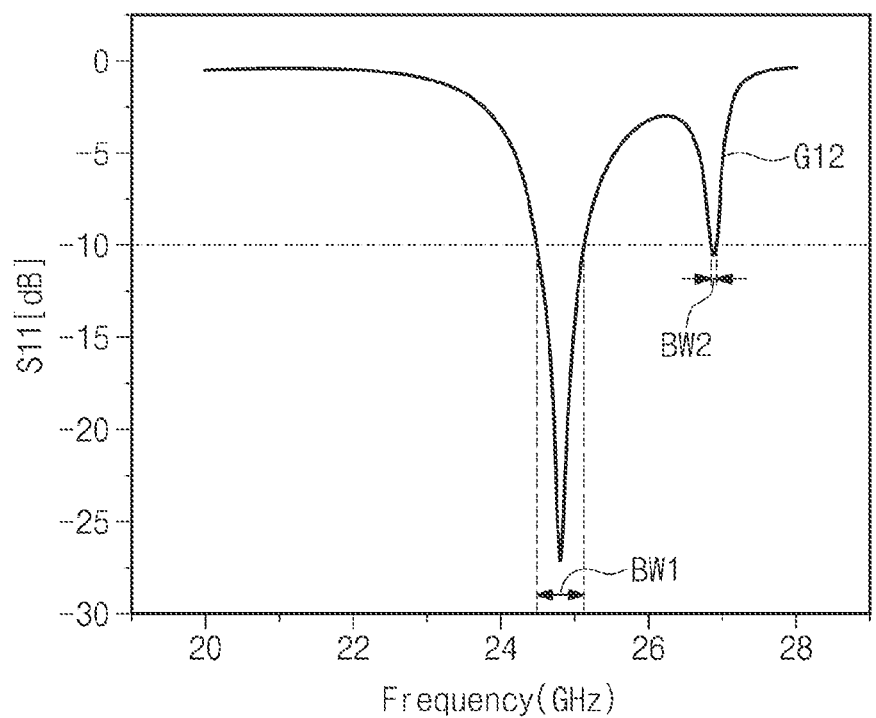

FIGS. 8A and 8B are graphs showing an S-parameter, according to frequency, of an antenna unit according to embodiments of the inventive concept.

Referring to FIGS. 6A, 8A, and 8B, S11 may be one of S-parameters. S11 may be a value representing a ratio of the strength of a reflected signal generated from the reflection of an input signal to the strength of the input signal. For example, S11 may be a reflection coefficient of the antenna unit AN (see FIG. 5A). The operation of the antenna unit AN (see FIG. 5A) may be determined on the basis of a case that S11 is about −10 dB. The value of about −10 dB may refer to a case in which the strength of a reflected signal generated from the reflection of an input signal is about 10% of the strength of the input signal. When S11 is less than about −10 dB, the antenna unit AN (see FIG. 5A) may be determined as operating in a corresponding frequency band.

The S-parameter of the antenna unit AN (see FIG. 5A) in which the predetermined gap GP between the main pattern MA and the plurality of first sub-patterns SA1 is a first gap may have the shape of a first graph G11 shown in FIG. 8A. The S-parameter of the antenna unit AN (see FIG. 5A) in which the predetermined gap GP between the main pattern MA and the plurality of first sub-patterns SA1 is a second gap different from the first gap may have the shape of a second graph G12 as shown in FIG. 8B. The first gap may be greater than the second gap.

The main pattern MA and the plurality of first sub-patterns SA1 may be capacitively coupled. Due to an electromagnetic interaction of the capacitive coupling, resonance frequencies of the main pattern MA and each of the plurality of first sub-patterns SA1 may vary depending on the predetermined gap GP and the second width WS of each of the plurality of first sub-patterns SAL1.

Referring to FIG. 8A, in the first graph G11, the main pattern MA may radiate a first signal. The first signal may have a first frequency band. The plurality of first sub-patterns SA1 may radiate a second signal. The second signal may have a second frequency band. A portion of the first frequency band and a portion of the second frequency band may overlap. The antenna unit AN (see FIG. 5A) may operate in a frequency band BW.

According to an embodiment of the inventive concept, the frequency band BW in which the antenna unit AN (see FIG. 5A) operates may be wideband. Accordingly, the display device DD (see FIG. 1A) with an improved frequency bandwidth may be provided.

Referring to FIG. 8B, in the second graph G12, the main pattern MA may radiate a third signal. The third signal may have a third frequency band BW1. The plurality of first sub-patterns SA1 may radiate a fourth signal. The fourth signal may have a fourth frequency band BW2. The third frequency band BW1 and the fourth frequency band BW2 may be different from each other. The antenna unit AN (see FIG. 5A) may operate in the plurality of frequency bands BW1 and BW2.

According to an embodiment of the inventive concept, the antenna unit AN (see FIG. 5A) may operate in the plurality of frequency bands different from one another. The antenna unit AN (see FIG. 5A) may operate in multiple frequency bands. Accordingly, the display device DD (see FIG. 1A) with an improved frequency bandwidth may be provided.

Figure 9A:
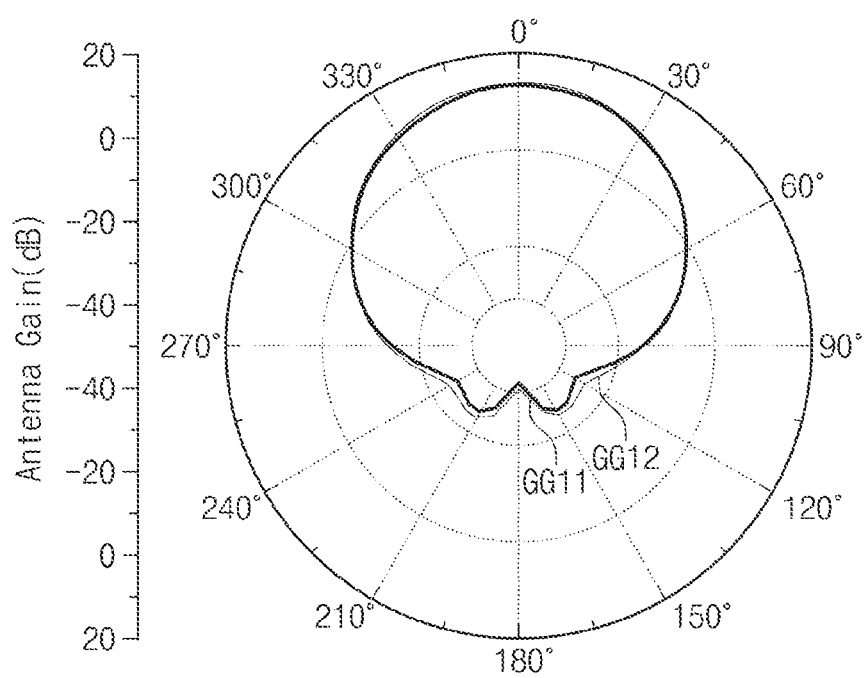
FIGS. 9A and 9B illustrate radiation patterns of an antenna unit according to embodiments of the inventive concept.
Figure 9B:
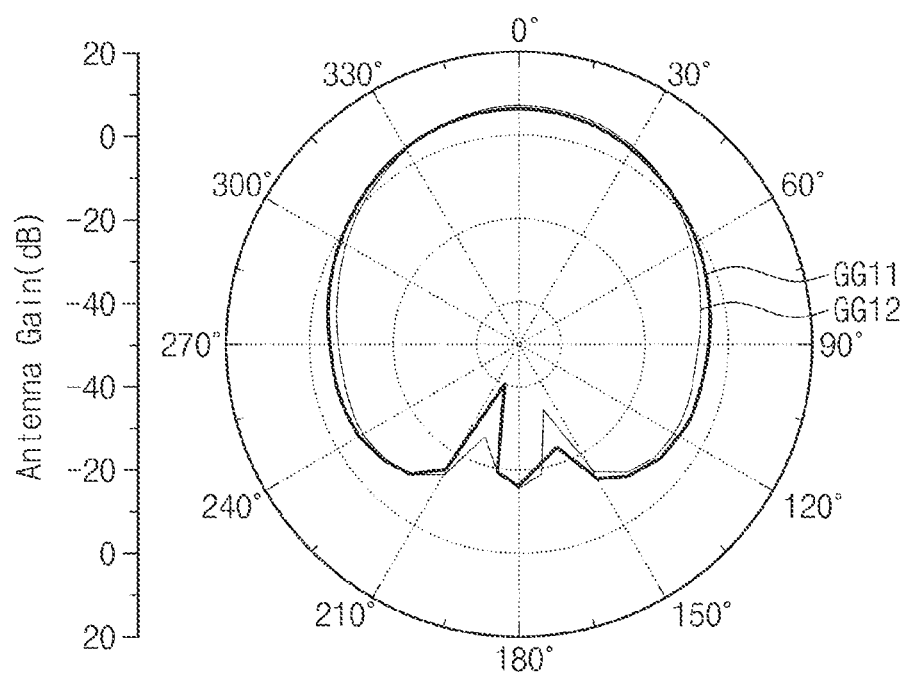

FIG. 9A illustrates a radiation pattern in a magnetic field of an antenna unit according to an embodiment of the inventive concept. FIG. 9B illustrates a radiation pattern in an electric field of an antenna unit according to an embodiment of the inventive concept.

Referring to FIGS. 6A, 8A, 9A, and 9B, FIGS. 9A and 9B illustrate radiation patterns of the first graph G11. When an antenna gain is about 0 dB or larger in a radiation pattern, a signal is radiated in a corresponding direction. In the radiation patterns, a direction indicated by 0° may be the third direction DR3.

FIG. 9A illustrates a radiation pattern of a cross section, taken along the second direction DR2, of the antenna unit AN (see FIG. 5A). In FIG. 9A, a direction indicated by 90° may be the second direction DR2. FIG. 9B illustrates a radiation pattern of a cross section, taken along the first direction DR1, of the antenna unit AN (see FIG. 5A). In FIG. 9B, a direction indicated by 90° may be the first direction DR1.

The main pattern MA may radiate a first signal GG11. The first signal GG11 may have the first frequency band. The plurality of first sub-patterns SA1 may radiate a second signal GG12. The second signal GG12 may have the second frequency band.

In FIG. 9A, a portion, in a radiation pattern of the first signal GG11, whose value is about 0 dB or larger, may indicate a thickness direction of the main pattern MA. The first signal GG11 may be radiated from the main pattern MA in the thickness direction of the main pattern MA. A portion, in a radiation pattern of the second signal GG12, whose value is about 0 dB or larger, may indicate a thickness direction of each of the plurality of first sub-patterns SA1. The second signal GG12 may be radiated from each of the plurality of first sub-patterns SA1 in the thickness direction of each of the plurality of first sub-patterns SAL The thickness direction may be the third direction DR3.

The first signal GG11 and the second signal GG12 may have an antenna gain of about 0 dB or larger in the range of about 330° to about 30° in the radiation patterns. In this case, the first signal GG11 and the second signal GG12 have directionality in the third direction DR3.

In the case of super high frequency (SHF) or millimeter wave (extremely high frequency (EHF)) having a high frequency band, signal loss may become larger as transmission distance gets longer. According to an embodiment of the inventive concept, however, the antenna unit AN (see FIG. 5A) may radiate a signal in the third direction DR3. The signal may have directionality. The antenna unit AN (see FIG. 5A) may improve the concentration of antenna gain. Accordingly, the display device DD (see FIG. 1A) may be provided which has an improved transmission distance for the signal transmitted and/or received via the antenna unit AN.

The shapes of the radiation patterns of the first signal GG11 and the second signal GG12 may be similar. When the radiation patterns of the signals are similar and the frequency bands of the signals overlap, the antenna unit AN (see FIG. 5A) may operate in a wide band.

According to an embodiment of the inventive concept, the frequency band BW in which the antenna unit AN (see FIG. 5A) operates may be wideband. Accordingly, the display device DD (see FIG. 1A) with an improved frequency bandwidth may be provided.

In FIG. 9B, a portion, in a radiation pattern of the first signal GG11, whose value is about 0 dB or larger, may indicate the thickness direction of the main pattern MA. The first signal GG11 may be radiated from the main pattern MA in the thickness direction of the main pattern MA. A portion, in a radiation pattern of the second signal GG12, whose value is about 0 dB or larger, may indicate the thickness direction of each of the plurality of first sub-patterns SA1. The second signal GG12 may be radiated from each of the plurality of first sub-patterns SA1 in the thickness direction of each of the plurality of first sub-patterns SA1.

According to an embodiment of the inventive concept, the antenna unit AN (see FIG. 5A) may radiate a signal in the third direction DR3. The signal may have directionality. The antenna unit AN (see FIG. 5A) may improve the concentration of antenna gain. Accordingly, the display device DD (see FIG. 1A) may be provided which has an improved transmission distance for the signal transmitted and/or received via the antenna unit AN.

Figure 10A:
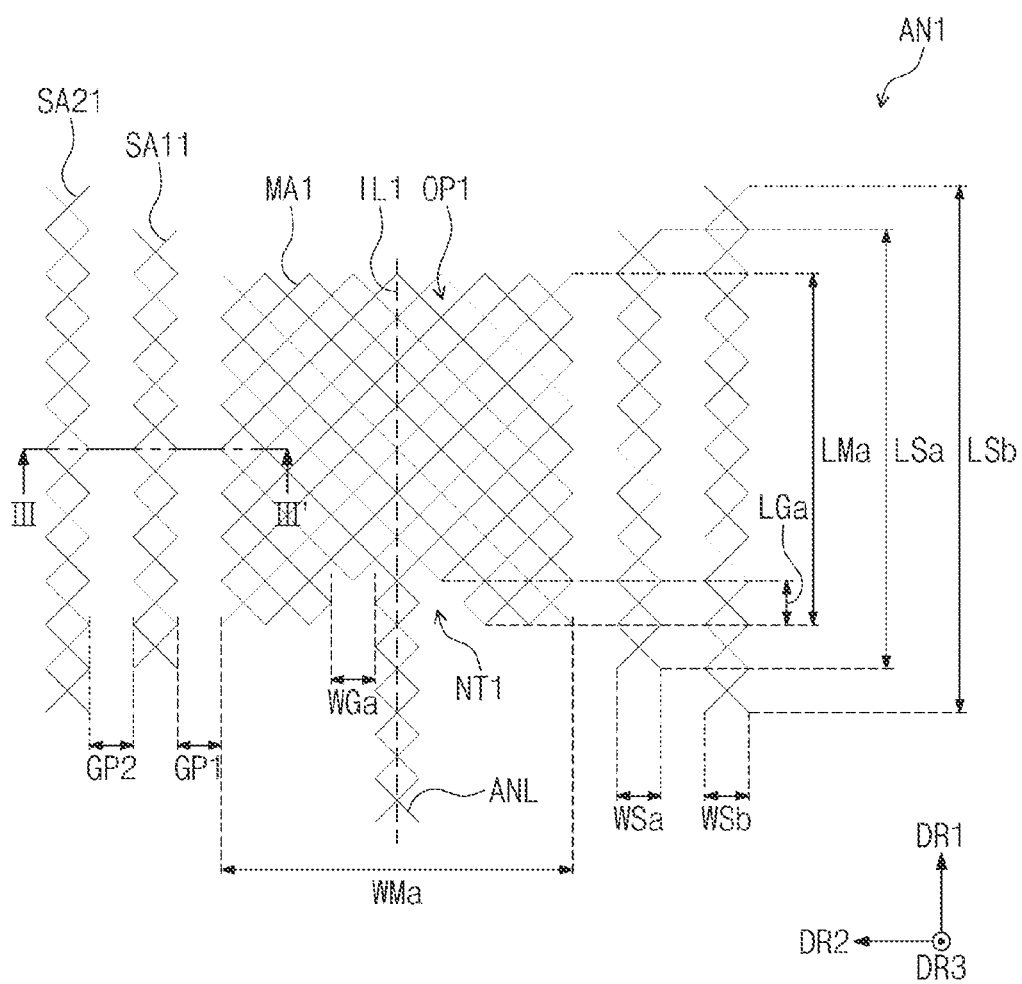
FIGS. 10A and 10B are plan views illustrating an antenna unit according to embodiments of the inventive concept.

FIG. 10A is a plan view illustrating an antenna unit according to an embodiment of the inventive concept.

Referring to FIG. 10A, an antenna unit AN1 may have a mesh structure. A plurality of openings OP1 may be defined in the antenna unit AN1. The antenna unit AN1 may include a main pattern MA1, a plurality of first sub-patterns SA11, and a plurality of second sub-patterns SA21. The main pattern MA1, the plurality of first sub-patterns SA11, and the plurality of second sub-patterns SA21 may be spaced apart from one another in the second direction DR2. The plurality of first sub-patterns SA11 may be disposed between the plurality of second sub-patterns SA21 and the main pattern MA1 in the second direction DR2. For example, one of the second sub-patterns SA21 may be spaced apart from the main pattern MA1 with one of the first sub-patterns SA11 disposed therebetween, as shown in FIG. 10A. The plurality of second sub-patterns SA21 may be capacitively coupled to the plurality of first sub-patterns SA11.

The main pattern MA1 may be designed to operate at a first frequency. For example, the main pattern MA1 may resonate at the first frequency, and thus, may operate at the first frequency. The main pattern MA1 may transmit and/or receive a signal having the first frequency. The main pattern MA1 may be a patch antenna. The first frequency may be about 38 GHz to about 40 GHz, and in an embodiment, may be about 39 GHz. However, this is exemplary, and the first frequency according to embodiments of the inventive concept may be defined as various frequencies according to a signal with which communication is performed.

The main pattern MA1 may have a first width LMa in the first direction DR1. The first width LMa may be inversely proportional to the first frequency. For example, the first width LMa may be about 2.4 mm to about 2.8 mm, and in an embodiment, may be about 2.58 mm. However, this is exemplary, and the first width LMa according to embodiments of the inventive concept may be determined by a dielectric disposed below the main pattern MA1 and the first frequency.

The main pattern MA1 may have a second width WMa in the second direction DR2. Impedance of the main pattern MA1 may be determined by the second width WMa. For example, the second width WMa may be about 1.8 mm to about 2.2 mm, and in an embodiment, may be about 2.0 mm.

A plurality of notches NT1 may be defined in a portion of the main pattern MA1 where the antenna line ANL is connected to the main pattern MA1. The impedance of the main pattern MA1 and the impedance of the antenna line ANL may be matched by the plurality of notches NT1. For example, the impedance of the main pattern MA1, the impedance of the antenna line ANL, and the impedance of the plurality of notches NT1 may be about the same. The main pattern MA1 and the antenna line ANL having the matched impedance may reduce loss of a signal transmitted to each other.

The impedance of the antenna line ANL may be about 4 Ω to about 55Ω, and in an embodiment, may be about 50Ω. A width LGa of each of the plurality of notches NT1 in the first direction DR1 may be about 0.8 mm to about 1.2 mm, and in an embodiment, may be about 0.98 mm. A width WGa of each of the plurality of notches NT1 in the second direction DR2 may be about 0.01 mm to about 0.4 mm, and in an embodiment, may be about 0.2 mm. The impedance of the main pattern MA1 and the impedance of the antenna line ANL may be matched by the plurality of notches NT1. For example, the impedance of the main pattern MA1, the impedance of the antenna line ANL, and the impedance of the plurality of notches NT1 may be about the same. For example, the impedances of the main pattern MA1 and the antenna line ANL may be matched at about 50Ω. Accordingly, the display device DD (see FIG. 1A) may be provided which has an improved signal transmission efficiency between the antenna line ANL and the main pattern MA1 and an improved communication efficiency.

Each of the plurality of first sub-patterns SA11 may be designed to operate at a second frequency different from the first frequency. For example, each of the plurality of first sub-patterns SA11 may resonate at the second frequency, and thus, may operate at the second frequency. Each of the plurality of first sub-patterns SA11 may transmit and/or receive a signal having the second frequency. The second frequency may be lower than the first frequency. The second frequency may be about 26 GHz to about 28 GHz, and in an embodiment, may be about 27.7 GHz. However, this is exemplary, and the second frequency according to embodiments of the inventive concept may be defined as various frequencies according to a signal with which communication is performed.

Each of the plurality of first sub-patterns SA11 may have a first width LSa in the first direction DR1. The first width LSa may be inversely proportional to the second frequency. The first width LSa may be determined by the second frequency. The first width LMa of the main pattern MA1 may be smaller than the first width LSa of each of the plurality of first sub-patterns SA11.

Each of the plurality of first sub-patterns SA11 may have a second width WSa in the second direction DR2. The second width WSa of the plurality of first sub-patterns SA11 may be smaller than the second width WMa of the main pattern MA1.

Each of the plurality of first sub-patterns SA11 may be spaced apart from the main pattern MA1 at a predetermined first gap GP1 in the second direction DR2. The first gap GP1 may be about 0.005 mm to about 0.015 mm, and in an embodiment, may be about 0.01 mm. The plurality of first sub-patterns SA11 may be spaced apart from one another in the second direction DR2 with the main pattern MA1 interposed therebetween.

Each of the plurality of second sub-patterns SA21 may operate at a third frequency different from the first frequency and the second frequency. For example, each of the plurality of second sub-patterns SA21 may resonate at the third frequency, and thus, may operate at the third frequency. Each of the plurality of second sub-patterns SA21 may transmit and/or receive a signal having the third frequency. The third frequency may be lower than the first frequency and the second frequency. The third frequency may be about 22 GHz to about 24 GHz, and in an embodiment, may be about 23.6 GHz. However, this is exemplary, and the third frequency according to embodiments of the inventive concept may be defined as various frequencies according to a signal with which communication is performed. In an embodiment, the first frequency is higher than the second frequency, and the second frequency is higher than the third frequency.

Each of the plurality of second sub-patterns SA21 may have a first width LSb in the first direction DR1. The first width LSb may be inversely proportional to the third frequency. The first width LSb may be determined by the third frequency. The first width LMa of the main pattern MA1 and the first width LSa of each of the plurality of first sub-patterns SA11 may be smaller than the first width LSb of each of the plurality of second sub-patterns SA21. In an embodiment, the first width LMa of the main pattern MA1 is smaller than the first width LSa of each of the plurality of first sub-patterns SA11, and the first width LSa of each of the plurality of first sub-patterns SA11 is smaller than the first width LSb of each of the plurality of second sub-patterns SA21.

Each of the plurality of second sub-patterns SA21 may have a second width WSb in the second direction DR2. The second width WSb of the plurality of second sub-patterns SA21 may be smaller than the second width WMa of the main pattern MA1.

The plurality of second sub-patterns SA21 may respectively be spaced apart from the plurality of first sub-patterns SA11 at a predetermined second gap GP2 in the second direction DR2. The second gap GP2 may be about 0.005 mm to about 0.015 mm, and in an embodiment, may be about 0.01 mm. The plurality of second sub-patterns SA21 may be spaced apart from the main pattern MA1 with the plurality of first sub-patterns SA11, respectively, interposed therebetween. The plurality of second sub-patterns SA21 may be spaced apart from one another in the second direction DR2 with the main pattern MA1 interposed therebetween. In an embodiment, the plurality of first sub-patterns SA1 is spaced apart from one another with the main pattern MA1 disposed therebetween, and the plurality of second sub-patterns SA21 is spaced apart from one another with the main pattern MA1 disposed therebetween. For example, adjacent first sub-patterns SA11 may be spaced apart from one another with the main pattern MA1 disposed therebetween, and adjacent second sub-patterns SA21 may be spaced apart from one another with the main pattern MA1 disposed therebetween.

The plurality of first sub-patterns SA11 may be symmetrical in relation to an imaginary line IL1 extending in the first direction DR1. The plurality of second sub-patterns SA21 may be symmetrical in relation to the imaginary line IL1. The imaginary line IL1 may extend along and overlap the main pattern MA1 and the antenna line ANL.

According to an embodiment of the inventive concept, the antenna unit AN1 may radiate a plurality of wireless communication signals in the third direction DR3 by the main pattern MA1, the plurality of first sub-patterns SA11, and the plurality of second sub-patterns SA21 disposed in bilateral symmetry in relation to the imaginary line IL1. The plurality of wireless communication signals may have certain directionality, and communication efficiency may be improved. Accordingly, the display device DD (see FIG. 1A) with improved communication efficiency may be provided.

The main pattern MA1 and the plurality of first sub-patterns SA11 may be capacitively coupled. The main pattern MA1 and the plurality of second sub-patterns SA21 may be capacitively coupled. The plurality of first sub-patterns SA1 may be capacitively coupled to the plurality of second sub-patterns SA21, respectively.

Due to an electromagnetic interaction of the capacitive coupling, resonance frequencies may change at which the main pattern MA1, the plurality of first sub-patterns SA11, and the plurality of second sub-patterns SA21 respectively resonate.

Figure 10B:
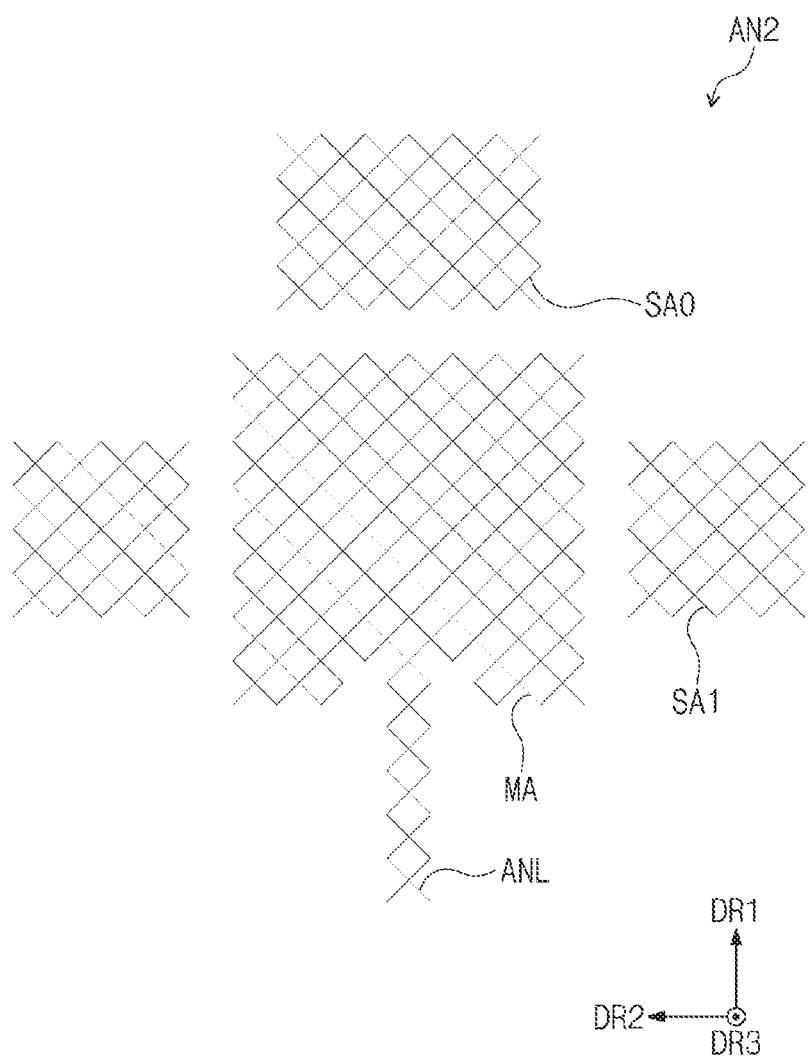

FIG. 10B is a plan view illustrating an antenna unit according to an embodiment of the inventive concept. For convenience of explanation, a further description of elements and technical aspects previously described may be omitted herein.

Referring to FIG. 10B, an antenna unit AN2 may include the main pattern MA, the plurality of first sub-patterns SA1, and a sub-pattern SA0.

The sub-pattern SA0 may be spaced apart from the main pattern MA in the first direction DR1. The sub-pattern SA0 and the main pattern MA may be capacitively coupled. Due to an electromagnetic interaction of the capacitive coupling of the main pattern MA, the plurality of first sub-patterns SA1, and the sub-pattern SA0, resonance frequencies may change at which the main pattern MA, the plurality of first sub-patterns SA1, and the sub-pattern SA0 respectively resonate.

A frequency band BW in which the antenna unit AN2 operates may be wideband or multiband depending on the resonance frequency at which the sub-pattern SA0 resonates. Accordingly, the display device DD (see FIG. 1A) with an improved frequency bandwidth may be provided.

Figure 11:
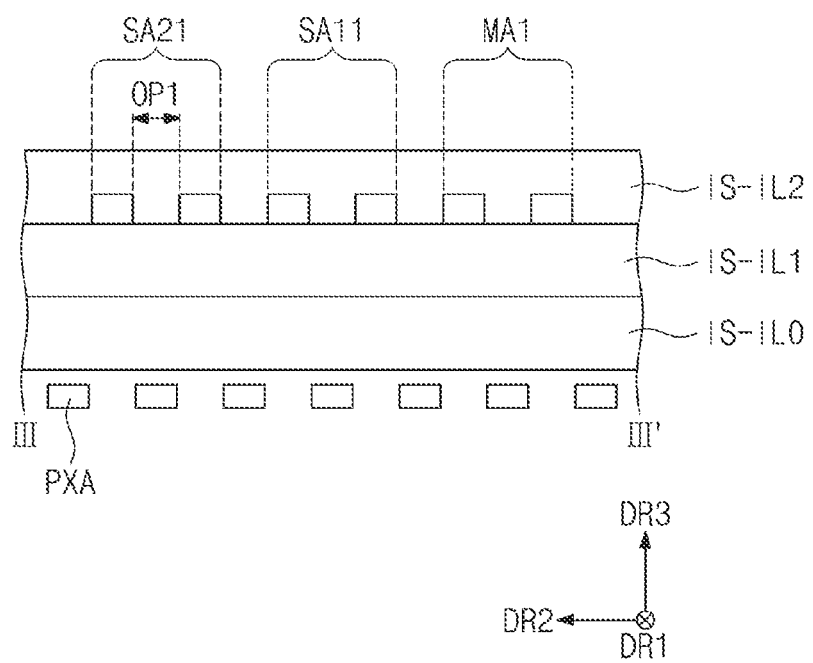
FIG. 11 is a cross-sectional view taken along line III-III' of FIG. 10A according to an embodiment of the inventive concept.

FIG. 11 is a cross-sectional view taken along line III-III' of FIG. 10A according to an embodiment of the inventive concept.

Referring to FIGS. 10A and 11, the main pattern MA1, the plurality of first sub-patterns SA11, and the plurality of second sub-patterns SA21 may be disposed on the first insulating layer IS-IL1. The second insulating layer IS-IL2 may cover the main pattern MA1, the plurality of first sub-patterns SA11, and the plurality of second sub-patterns SA21. However, this is exemplary, and the arrangement of the main pattern MA1, the plurality of first sub-patterns SA11, and the plurality of second sub-patterns SA21 according to embodiments of the inventive concept is not limited thereto. For example, in an embodiment, the main pattern MA1, the plurality of first sub-patterns SA11, and the plurality of second sub-patterns SA21 may be disposed on the base insulating layer IS-IL0, and the first insulating layer IS-IL1 may cover the main pattern MA1, the plurality of first sub-patterns SA11, and the plurality of second sub-patterns SA21.

When viewed in a plane, the plurality of openings OP1 may overlap the light emitting area PXA. When viewed in a plane, the main pattern MA1, the plurality of first sub-patterns SA11, and the plurality of second sub-patterns SA21 may be non-overlapping with the light emitting area PXA. For example, in an embodiment, when viewed in a plane, the main pattern MA1, the plurality of first sub-patterns SA11, and the plurality of second sub-patterns SA21 do not overlap the light emitting area PXA.

Figure 12:
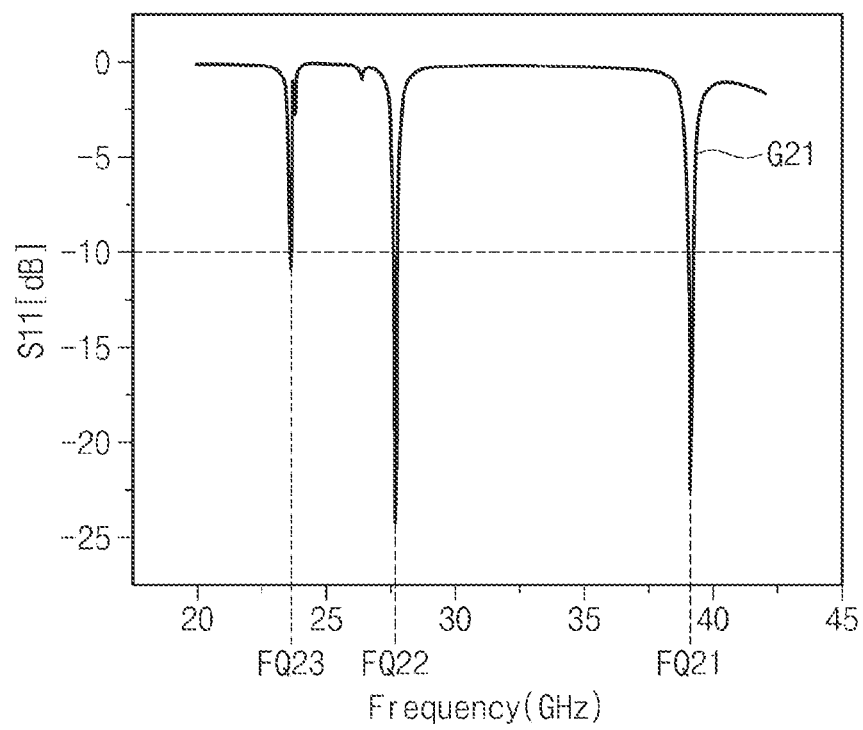
FIG. 12 is a graph showing an S-parameter, according to frequency, of an antenna unit according to an embodiment of the inventive concept.

FIG. 12 is a graph showing an S-parameter, according to frequency, of an antenna unit according to an embodiment of the inventive concept.

Referring to FIGS. 10A and 12, the S-parameter of the antenna unit AN1 may have a shape of a third graph G21. The main pattern MA1, the plurality of first sub-patterns SA11, and the plurality of second sub-patterns SA21 may be capacitively coupled to one another.

In the third graph G21, the main pattern MA1 may radiate a first signal. The first signal may have a first frequency band FQ21. The plurality of first sub-patterns SA11 may radiate a second signal. The second signal may have a second frequency band FQ22. The plurality of second sub-patterns SA21 may radiate a third signal. The third signal may have a third frequency band FQ23. The first frequency band FQ21, the second frequency band FQ22, and the third frequency band FQ23 may be different from one another. The antenna unit AN1 may operate in the plurality of frequency bands FQ21, FQ22, and FQ23.

According to an embodiment of the inventive concept, the antenna unit AN1 may operate in the plurality of frequency bands different from one another. Thus, the antenna unit AN1 may operate in multiple frequency bands. Accordingly, the display device DD (see FIG. 1A) with an improved frequency bandwidth may be provided.

Figure 13A:
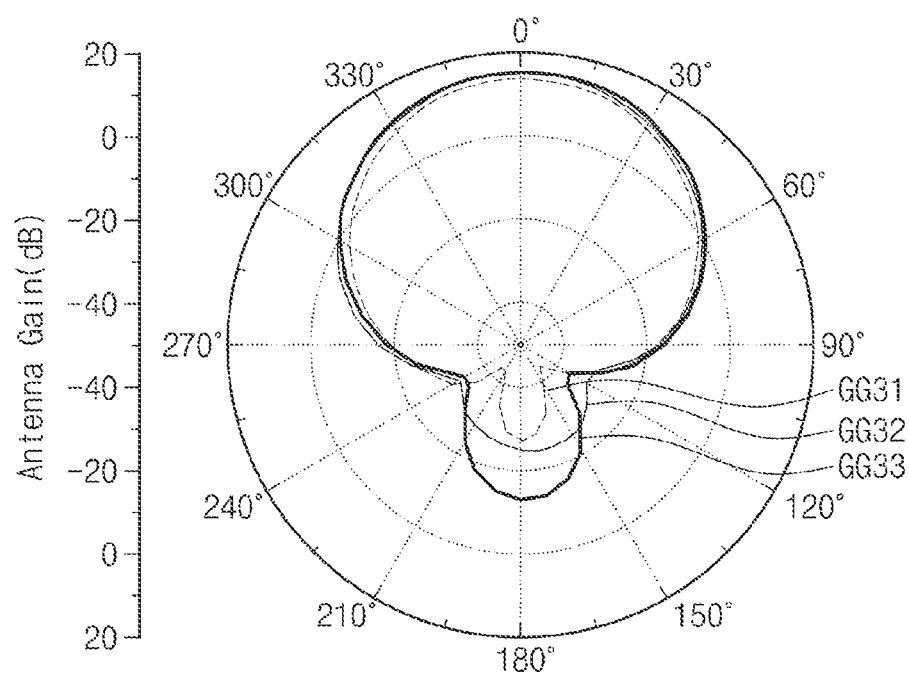
FIGS. 13A and 13B illustrate radiation patterns of an antenna unit according to embodiments of the inventive concept.
Figure 13B:
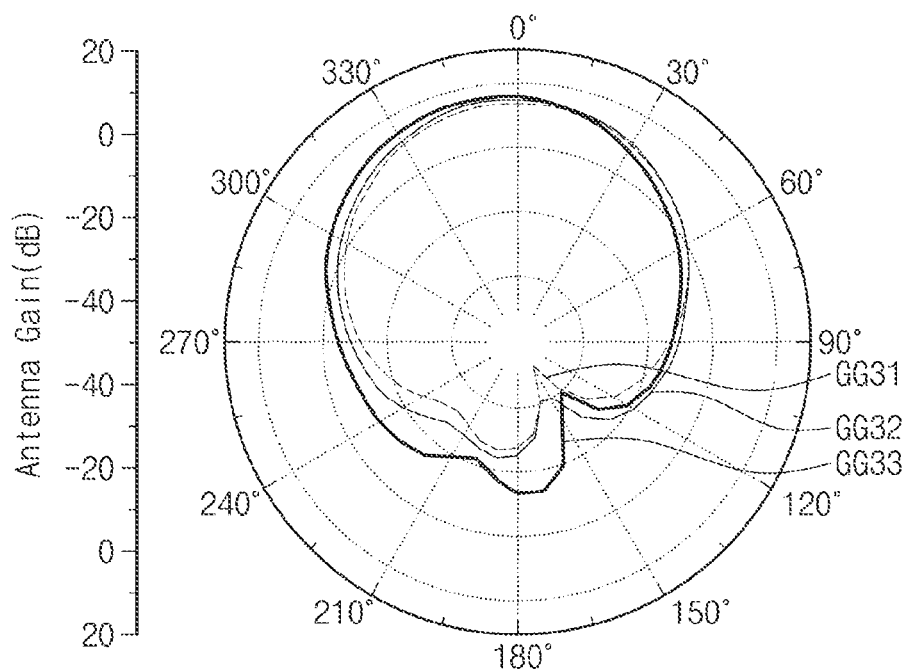

FIG. 13A illustrates a radiation pattern in a magnetic field of an antenna unit according to an embodiment of the inventive concept. FIG. 13B illustrates a radiation pattern in an electric field of an antenna unit according to an embodiment of the inventive concept.

Referring to FIGS. 10A, 12, 13A, and 13B, FIGS. 13A and 13B illustrate radiation patterns of the third graph G21. The main pattern MA1 may radiate a first signal GG31. The first signal GG31 may have the first frequency band. The plurality of first sub-patterns SA11 may radiate a second signal GG32. The second signal GG32 may have the second frequency band. The plurality of second sub-patterns SA21 may radiate a third signal GG33. The third signal GG33 may have the third frequency band.

A portion, in a radiation pattern of the first signal GG31, whose value is about 0 dB or larger, may indicate a thickness direction of the main pattern MA1. The first signal GG31 may be radiated from the main pattern MA1 in the thickness direction of the main pattern MA1. A portion, in a radiation pattern of the second signal GG32, whose value is about 0 dB or larger, may indicate a thickness direction of each of the plurality of first sub-patterns SA11. The second signal GG32 may be radiated from each of the plurality of first sub-patterns SA11 in the thickness direction of each of the plurality of first sub-patterns SA11. A portion, in a radiation pattern of the third signal GG33, whose value is about 0 dB or larger, may indicate a thickness direction of each of the plurality of second sub-patterns SA21. The third signal GG33 may be radiated from each of the plurality of second sub-patterns SA21 in the thickness direction of each of the plurality of second sub-patterns SA21. The thickness direction may be the third direction DR3.

The first signal GG31, the second signal GG32, and the third signal GG33 may have an antenna gain of about 0 dB or larger in the range of about 330° to about 30° in the radiation patterns. In this case, the first signal GG31, the second signal GG32, and the third signal GG33 have directionality in the third direction DR3.

According to an embodiment of the inventive concept, the antenna unit AN1 may radiate a signal in the third direction DR3. The signal may have directionality. The antenna unit AN1 may improve the concentration of antenna gain. Accordingly, the display device DD (see FIG. 1A) may be provided which has an improved transmission distance for the signal transmitted and/or received via the antenna unit AN1.

The shapes of the radiation patterns of the first signal GG31, the second signal GG32, and the third signal GG33 may be different. When the frequency bands of the signals are different, a multiband operation of the antenna unit AN1 may be provided.

According to an embodiment of the inventive concept, the frequency bands FQ21, FQ22, and FQ23 in which the antenna unit AN1 operates may be multiband. Accordingly, the display device DD (see FIG. 1A) with an improved frequency bandwidth may be provided.

Figure 14:
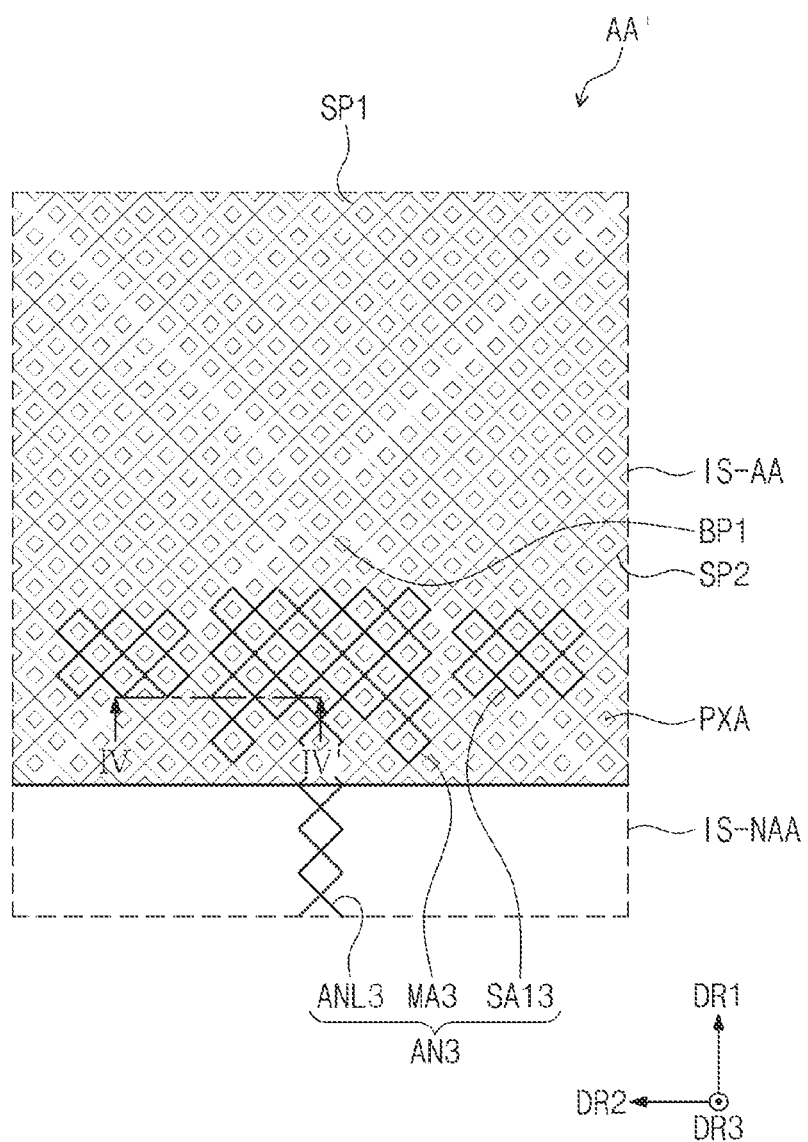
FIG. 14 is an enlarged plan view of area AA' of FIG. 5A according to an embodiment of the inventive concept.

FIG. 14 is an enlarged plan view of area AA' of FIG. 5A according to an embodiment of the inventive concept. For convenience of explanation, a further description of elements and technical aspects previously described may be omitted herein.

Referring to FIG. 14, an antenna unit AN3 may include a main pattern MA3, a plurality of first sub-patterns SA13, and the antenna line ANL3. Although one antenna unit AN3 is illustrated in FIG. 14, the antenna unit AN3 may be provided in plurality in embodiments.

The antenna unit AN3 may be disposed on a first sensing pattern SP1 of the first sensing patterns SP1 and a plurality of second sensing patterns SP2 adjacent thereto. However, the illustration of FIG. 14 is exemplary, and a component overlapping the antenna unit AN3 may be changed according to the size and position of the antenna unit AN3 according to embodiments. For example, in an embodiment, the antenna unit AN3 may be disposed only on the first sensing pattern SP1.

Because the antenna unit AN3 overlaps the first sensing pattern SP1 and the plurality of second sensing patterns SP2, the display device DD (see FIG. 1A) may sense an external input even in an area in which the antenna unit AN3 is disposed. Accordingly, in embodiments, even when the antenna unit AN3 is disposed, the surface area of the sensing part SP (see FIG. 1A) of the input sensor IS (see FIG. 1A) is not reduced.

Figure 15:
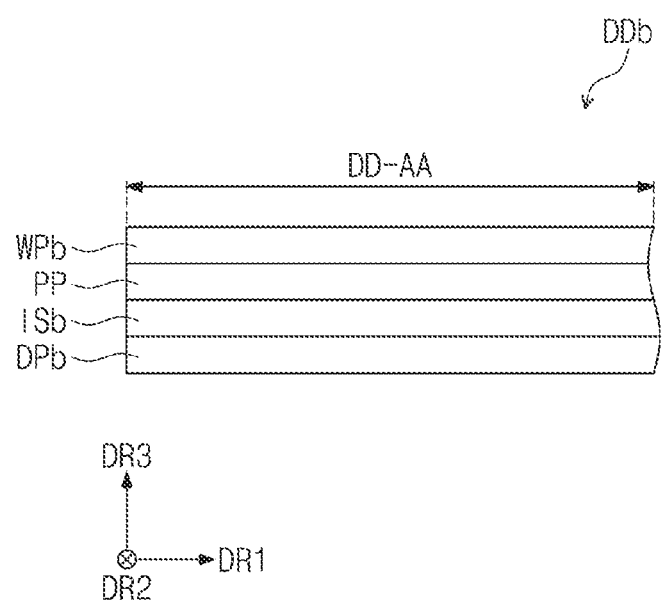
FIG. 15 is a cross-sectional view of a display device according to an embodiment of the inventive concept.

FIG. 15 is a cross-sectional view of a display device according to an embodiment of the inventive concept.

Referring to FIG. 15, a display device DDb may include a display panel DPb, an input sensor ISb, an antenna layer PP, and a window WPb.

The input sensor ISb may be disposed on the display panel DPb. The input sensor ISb may sense an external input applied from the outside. The external input may be a user input. The user input may include various types of external inputs such as, for example, a part of a user's body, light, heat, pen, and pressure.

According to an embodiment of the inventive concept, the antenna layer PP may be disposed on the input sensor ISb. The antenna layer PP may be formed on the input sensor ISb through a continuous process. Alternatively, the antenna layer PP may be bonded to the input sensor ISb by an adhesive member. The adhesive member may include a typical adhesive or a typical detachable adhesive. For example, the adhesive member may be a transparent adhesive member such as a Pressure Sensitive Adhesive (PSA) film, an Optically Clear Adhesive (OCA) film, or an Optically Clear Resin (OCR).

The antenna layer PP may be disposed between the input sensor ISb and the window WPb.

Figure 16:
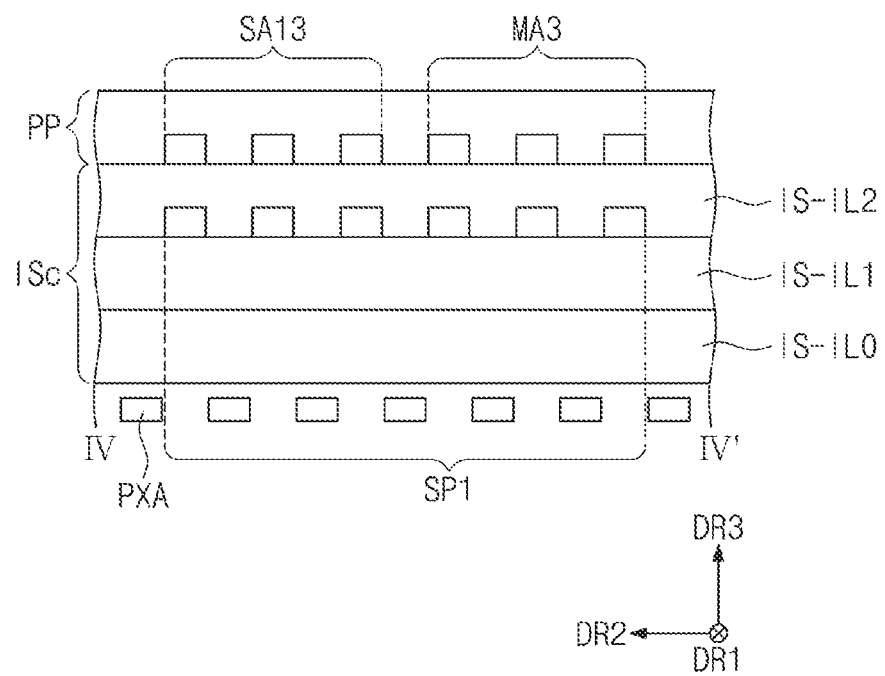
FIG. 16 is a cross-sectional view taken along line IV-IV' of FIG. 14 according to an embodiment of the inventive concept.

FIG. 16 is a cross-sectional view taken along line IV-IV' of FIG. 14 according to an embodiment of the inventive concept.

Referring to FIG. 16, the first sensing pattern SP1 may be disposed on the first insulating layer IS-IL1. The second insulating layer IS-IL2 may cover the first sensing pattern SP1. The antenna layer PP may be disposed on an input sensor ISc. The main pattern MA3 and each of the first sub-patterns SA13 may be disposed on the second insulating layer IS-IL2. When viewed in a plane, each of the main pattern MA3 and the first sub-pattern SA13 may overlap the first sensing pattern SP1. When viewed in a plane, the first sensing pattern SP1, the main pattern MA3, and the first sub-pattern SA13 may be non-overlapping with the light emitting area PXA. For example, in an embodiment, when viewed in a plane, each of the main pattern MA3 and the first sub-pattern SA13 overlaps the first sensing pattern SP1, and the first sensing pattern SP1, the main pattern MA3, and the first sub-pattern SA13 do not overlap the light emitting area PXA.

According to an embodiment of the inventive concept, the first sensing pattern SP1 may be disposed below the main pattern MA3 and the first sub-pattern SA13. Because the main pattern MA3 and the first sub-pattern SA13 overlap the first portion SP1, the display device DD (see FIG. 1A) may sense an external input even in an area in which the main pattern MA3 and the first sub-pattern SA13 are disposed. Accordingly, in an embodiment, the surface area of the sensing part of the input sensor ISc is not reduced.

Figure 17:
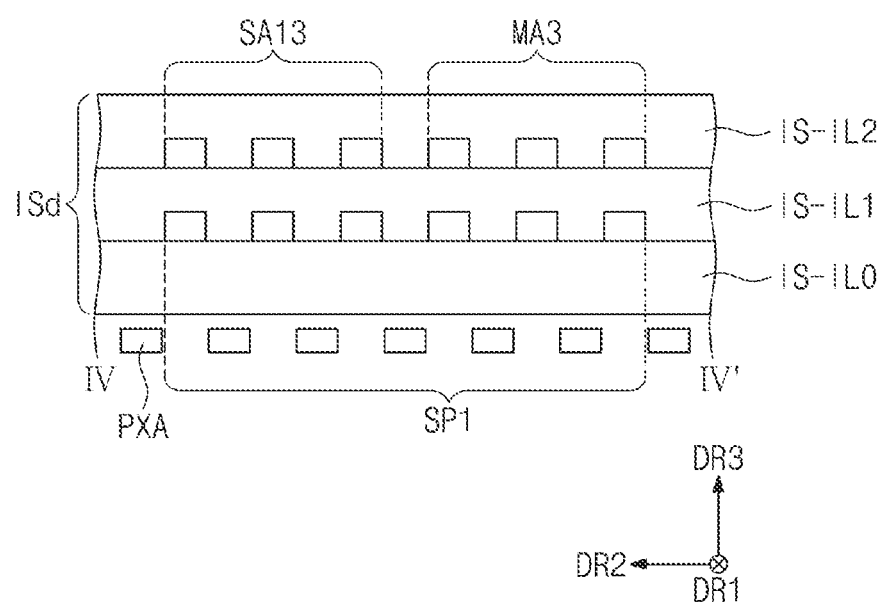
FIG. 17 is a cross-sectional view taken along line IV-IV' of FIG. 14 according to an embodiment of the inventive concept.

FIG. 17 is a cross-sectional view taken along line IV-IV' of FIG. 14 according to an embodiment of the inventive concept.

Referring to FIG. 17, an input sensor ISd may include the base insulating layer IS-IL0, the first insulating layer IS-IL1, the second insulating layer IS-IL2, the first sensing pattern SP1, the main pattern MA3, and the first sub-pattern SA13. The input sensor ISd may be a top bridge structure in which the plurality of second bridge patterns BP2 (see FIG. 5A) is disposed on the plurality of first bridge patterns BP1 (see FIG. 5A). As described above, the first sensing pattern SP1 is part of the first sensing electrode TEE The first sensing pattern SP1 may be disposed on the base insulating layer IS-IL0. The first insulating layer IS-IL1 may cover the first sensing pattern SP1. The main pattern MA3 and the first sub-pattern SA13 may be disposed on the first insulating layer IS-ILE The second insulating layer IS-IL2 may cover the main pattern MA3 and the first sub-pattern SA13.

When viewed in a plane, each of the main pattern MA3 and the first sub-pattern SA13 may overlap the first sensing pattern SP1. When viewed in a plane, the first sensing pattern SP1, the main pattern MA3, and the first sub-pattern SA13 may be non-overlapping with the light emitting area PXA. For example, in an embodiment, when viewed in a plane, each of the main pattern MA3 and the first sub-pattern SA13 overlaps the first sensing pattern SP1, and the first sensing pattern SP1, the main pattern MA3, and the first sub-pattern SA13 do not overlap the light emitting area PXA.

According to an embodiment of the inventive concept, each of the main pattern MA3 and the first sub-pattern SA13 may overlap the first sensing pattern SP1 even in the form in which the antenna unit AN3 (see FIG. 14) is embedded in the input sensor ISd. In this case, even in an area in which the main pattern MA3 and the first sub-pattern SA13 are disposed, the display device DD (see FIG. 1A) may sense an external input. Accordingly, in an embodiment, the surface area of the sensing part of the input sensor ISd is not reduced.

According to an embodiment of the inventive concept, the antenna unit may radiate a plurality of wireless communication signals in the thickness direction by the main pattern and the plurality of first sub-patterns disposed in bilateral symmetry. The plurality of wireless communication signals may have certain directionality. The antenna unit may improve the concentration of antenna gain. Accordingly, embodiments may provide a display device having improved communication efficiency and signal transmission distance.

According to an embodiment of the inventive concept, the frequency band in which the antenna unit operates may be a wide band, or may be multiple frequency bands including a plurality of frequency bands different from one another. Accordingly, a display device with improved frequency bandwidth may be provided.

While the inventive concept has been particularly shown and described with reference to the embodiments thereof, it will be understood by those of ordinary skill in the art that various changes in form and detail may be made therein without departing from the spirit and scope of the inventive concept as defined by the following claims.

What is claimed is:

1. A display device, comprising:
a display panel in which an active area including a light emitting area and a peripheral area adjacent to the active area are defined; and
an antenna unit comprising a main pattern, a first sub-pattern, and an antenna line,
wherein the main pattern is disposed in the active area, transmits and/or receives a first signal, and operates at a first frequency,
the antenna line is disposed on the display panel and extends from the main pattern, and
the first sub-pattern is disposed in the active area, is spaced apart from the main pattern in a first direction, is capacitively coupled to the main pattern, and operates at a second frequency different from the first frequency, and
a width from a first end of the main pattern to a second opposing end of the main pattern in a second direction crossing the first direction is smaller than a width from a first end of the first sub-pattern to a second opposing end of the first sub-pattern in the second direction,
a second sub-pattern spaced apart from the first sub-pattern in the first direction,
wherein the second sub-pattern operates at a third frequency different from the first frequency and the second frequency and is capacitively coupled to the first sub-pattern.

2. The display device of claim 1, wherein
the first frequency is lower than the second frequency.

3. The display device of claim 2, wherein a surface area of the main pattern is larger than a surface area of the first sub-pattern.

4. The display device of claim 1, wherein
the first sub-pattern is provided in plural, and
the plurality of first sub-patterns is spaced apart from one another with the main pattern disposed therebetween.

5. The display device of claim 4, wherein the plurality of first sub-patterns is spaced apart in the first direction, and the plurality of first sub-patterns is symmetrical in relation to an imaginary line extending in the second direction crossing the first direction.

6. The display device of claim 1, wherein
the first signal is radiated from the main pattern and has a first frequency band, and a second signal radiated from the first sub-pattern has a second frequency band, and
a portion of the first frequency band overlaps a portion of the second frequency band.

7. The display device of claim 6, wherein the first signal is radiated from the main pattern in a thickness direction of the main pattern, and the second signal is radiated from the first sub-pattern in a thickness direction of the first sub-pattern.

8. The display device of claim 1, wherein the second sub-pattern is spaced apart from the main pattern with the first sub-pattern disposed therebetween.

9. The display device of claim 1, wherein a width of the main pattern in the first direction is larger than a width of the first sub-pattern in the first direction, and the width of the main pattern in the first direction is larger than a width of the second sub-pattern in the first direction.

10. The display device of claim 1, wherein each of the first sub-pattern and the second sub-pattern is provided in plural, and the plurality of first sub-patterns is spaced apart from one another with the main pattern disposed therebetween, and the plurality of second sub-patterns is spaced apart from one another with the main pattern disposed therebetween.

11. The display device of claim 10, wherein the plurality of first sub-patterns is symmetrical in relation to an imaginary line extending along the antenna line, and the plurality of second sub-patterns is symmetrical in relation to the imaginary line.

12. The display device of claim 1, wherein the first signal is radiated from the main pattern and has a first frequency band, a second signal radiated from the first sub-pattern has a second frequency band, and a third signal radiated from the second sub-pattern has a third frequency band, and the first frequency band, the second frequency band, and the third frequency band are different from one another.

13. The display device of claim 12, wherein the first signal is radiated from the main pattern in a thickness direction of the main pattern, the second signal is radiated from the first sub-pattern in a thickness direction of the first sub-pattern, and the third signal is radiated from the second sub-pattern in a thickness direction of the second sub-pattern.

14. The display device of claim 1, further comprising:
a sensing electrode disposed on the display panel and including a plurality of first patterns disposed on a first layer and a plurality of second patterns disposed on a second layer different from the first layer,
wherein the main pattern and the first sub-pattern are disposed in a same layer as the plurality of first patterns or the plurality of second patterns.

15. The display device of claim 1, further comprising:
an input sensor disposed on the display panel and including a plurality of sensing electrodes,
wherein the main pattern and the first sub-pattern are disposed on the input sensor.

16. The display device of claim 15, wherein the plurality of sensing electrodes overlaps the main pattern and the first sub-pattern.

17. The display device of claim 1, wherein the main pattern and the first sub-pattern have a mesh structure.

18. The display device of claim 17, wherein the main pattern and the first sub-pattern do not overlap the light emitting area.

19. The display device of claim 1, wherein a width of the main pattern in the first direction is larger than a width of the antenna line in the first direction.

20. A display device, comprising:
a display panel in which an active area including a light emitting area and a peripheral area adjacent to the active area are defined;
an antenna unit comprising a main pattern, a first sub-pattern, and an antenna line,
wherein the main pattern is disposed in the active area, transmits and/or receives a first signal, and operates at a first frequency,
the antenna line is disposed on the display panel and extends from the main pattern, and
the first sub-pattern is disposed in the active area, is spaced apart from the main pattern in a first direction, is capacitively coupled to the main pattern, and operates at a second frequency different from the first frequency;
a second sub-pattern spaced apart from the first sub-pattern in the first direction,
wherein the second sub-pattern operates at a third frequency different from the first frequency and the second frequency and is capacitively coupled to the first sub-pattern,
the first frequency is higher than the second frequency, and the second frequency is higher than the third frequency,
a width of the main pattern in a second direction crossing the first direction is smaller than a width of the first sub-pattern in the second direction, and
the width of the first sub-pattern in the second direction is smaller than a width of the second sub-pattern in the second direction.

21. A display device, comprising:
a display panel in which an active area including a light emitting area and a peripheral area adjacent to the active area are defined; and
an antenna unit disposed on the display panel and overlapping the active area,
wherein the antenna unit comprises:
a patch antenna that operates at a first frequency and includes a line portion and a patch portion having a width larger than a width of the line portion;
a plurality of first sub-patterns that operates at a second frequency different from the first frequency and are spaced apart from one another with the patch portion disposed therebetween; and
a plurality of second sub-patterns that operates at a third frequency different from the first frequency and the second frequency, and are spaced apart from the patch portion with the plurality of first sub-patterns respectively disposed therebetween,
wherein a width of the patch portion is smaller than a width of each of the plurality of first sub-patterns, and the width of each of the plurality of first sub-patterns is smaller than a width of each of the plurality of second sub-patterns.

22. The display device of claim 21, wherein the antenna unit does not overlap the light emitting area when viewed in a plane.

23. The display device of claim 22, further comprising:
a sensing electrode disposed on the display panel and including a plurality of first patterns disposed on a first layer and a plurality of second patterns disposed on a second layer different from the first layer,
wherein the antenna unit is disposed in a same layer as the plurality of first patterns, and disposed in a different layer from the plurality of second patterns.

24. The display device of claim 23, wherein
the plurality of second patterns is disposed below the antenna unit, and
the plurality of second patterns overlaps the antenna unit when viewed in the plane.

25. The display device of claim 23, wherein
the plurality of second patterns is disposed on the antenna unit, and
the plurality of second patterns does not overlap the antenna unit when viewed in the plane.

26. The display device of claim 22, further comprising:
an input sensor disposed on the display panel and including a plurality of sensing electrodes,
wherein the antenna unit is disposed on the input sensor.

27. The display device of claim 26, wherein the plurality of sensing electrodes overlaps the antenna unit when viewed in the plane.

28. The display device of claim 21, wherein each of the plurality of second sub-patterns is spaced apart from an adjacent one of the plurality of first sub-patterns at a predetermined gap.

* * * * *